(12) United States Patent
Paz de Araujo et al.

(10) Patent No.: US 7,872,900 B2
(45) Date of Patent: *Jan. 18, 2011

(54) CORRELATED ELECTRON MEMORY

(75) Inventors: Carlos A. Paz de Araujo, Colorado Springs, CO (US); Jolanta Celinska, Colorado Springs, CO (US); Matthew D. Brubaker, Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 512 days.

This patent is subject to a terminal disclaimer.

(21) Appl. No.: 11/937,461

(22) Filed: Nov. 8, 2007

(65) Prior Publication Data
US 2008/0106925 A1 May 8, 2008

Related U.S. Application Data

(60) Provisional application No. 60/858,218, filed on Nov. 8, 2006, provisional application No. 60/904,768, filed on Mar. 2, 2007, provisional application No. 60/906,158, filed on Mar. 9, 2007, provisional application No. 60/913,245, filed on Apr. 20, 2007.

(51) Int. Cl.
*G11C 11/00* (2006.01)
(52) U.S. Cl. ..................... 365/148; 365/163
(58) Field of Classification Search .............. 365/148, 365/163, 159
See application file for complete search history.

(56) References Cited

U.S. PATENT DOCUMENTS

| | | | |
|---|---|---|---|
| 6,624,463 B2 | 9/2003 | Kim et al. | |
| 6,841,833 B2 | 1/2005 | Hsu et al. | |
| 6,903,361 B2 | 6/2005 | Gilton | |
| 7,038,935 B2 | 5/2006 | Rinerson et al. | |
| 7,292,469 B2 * | 11/2007 | Lee et al. | 365/163 |
| 7,639,521 B2 * | 12/2009 | Baek et al. | 365/148 |
| 7,639,523 B2 * | 12/2009 | Celinska et al. | 365/148 |
| 2007/0114509 A1 * | 5/2007 | Herner | 257/4 |
| 2008/0106926 A1 * | 5/2008 | Brubaker et al. | 365/148 |

OTHER PUBLICATIONS

Choi et al.; "Resistive Switching Mechanisms of $TiO_2$ Thin Films Grown by Atomic-Layer Deposition"; *Journal of Applied Physics* 98, 033715 (2005).
Inone et al.; "Nonpolar Resistance Switching of Metal/Binary-Transition-Metal Oxides/Metal Sandwiches: Homogeneous/Inhomogeneous Transition of Current Distribution"; *arXiv:Cond-mat*/0702564 v.1; Feb. 26, 2007.
Lai, Stephen; "Current Status of the Phase Change Memory and Its Future"; Intel Corporation, Research note RN2-05 (2005).

(Continued)

*Primary Examiner*—Vu A Le
(74) *Attorney, Agent, or Firm*—Patton Boggs LLP

(57) ABSTRACT

A non-volatile resistive switching memory that includes a homogeneous material which changes between the insulative and conductive states due to correlations between electrons, particularly via a Mott transition. The material is crystallized into the conductive state and does not require electroforming.

4 Claims, 10 Drawing Sheets

OTHER PUBLICATIONS

Mizutani, Uichiro; *Introduction to the Electron Theory of Metals*; Cambridge University Press; Cambridge, UK; 2001; pp. 444-447.

Montorsi Ed., Arianna; *The Hubbard Model*; World Scientific; Singapore; 1992.

Mott, Sir Nevill; *Metal-Insulator Transitions*; Second Edition, Taylor & Francis; London; 1990.

Nakajima et al.; "Surface Metallic Nature Caused by an In-Gap State of Reduced NiO: A Photoemission Study"; *Journal of Electron Spectroscopy and Related Phenomena*; 144 147 (2005); pp. 873-875.

Orgal, Leslie E.; An Introduction to Transition-Metal Chemistry: Ligand-Field Theory; Methuen & Co. Ltd.; London; 1960.

Park et al.; "Influence of Oxygen Content on Electrical Properties of NiO Films Grown by RF Reactive Sputtering"; *J. Vac. Sci. Technol.* B24(5); Sep./Oct. 2006.

Park et al.; "Reproducible Resistive Switching in Nonstoichiometric Nickel Oxide Films Grown by RF Reactive Sputtering for Resistive Random Access Memory Applications"; *J. Vac. Sci. Technol.* A 23(5); Sep./Oct. 2005.

*Wikepedia*;"Ligand Field Theory"; http://en.wikipedia.org/wik/Ligand_field theory.

* cited by examiner

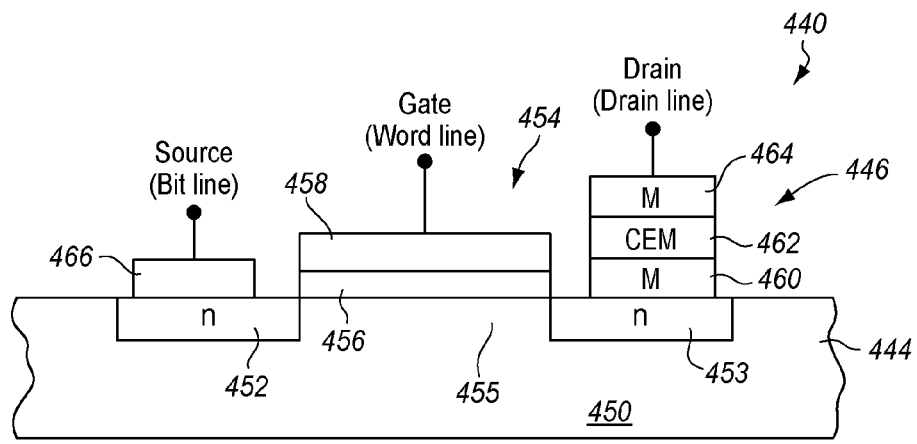
FIG. 15
FIG. 16
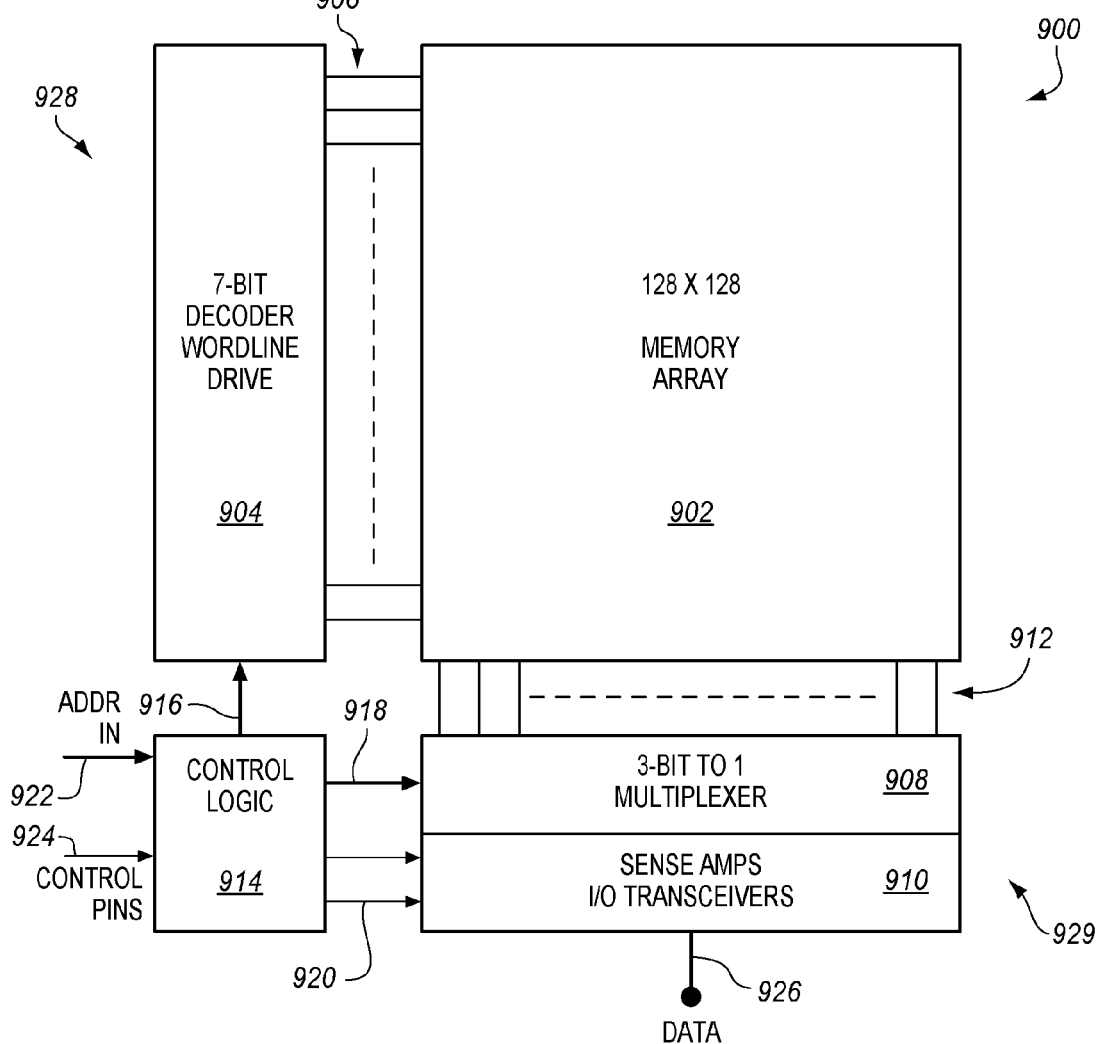

CORRELATED ELECTRON MEMORY

CROSS-REFERENCE TO RELATED APPLICATIONS

This Application is a Non-Provisional Application claiming the benefit of: Provisional (35 USC 119(e)) Application No. 60/858,218 filed on Nov. 8, 2006; Provisional (35 USC 119(e)) Application No. 60/904,768 filed on Mar. 2, 2007; Provisional (35 USC 119(e)) Application No. 60/906,158 filed on Mar. 9, 2007; and Provisional (35 USC 119(e)) Application No. 60/913,245 filed on May 21, 2007. All of the foregoing provisional applications are hereby incorporated by reference to the same extent as though fully disclosed herein.

FIELD OF THE INVENTION

The invention in general relates to integrated circuit memories, and in particular, to the formation of non-volatile integrated circuit memories containing materials which exhibit a change in resistance.

BACKGROUND OF THE INVENTION

Non-volatile memories are a class of integrated circuits in which the memory cell or element does not lose its state after the power supplied to the device is turned off. The earliest computer memories, made with rings of ferrite that could be magnetized in two directions, were non-volatile. As semiconductor technology evolved into higher levels of miniaturization, the ferrite devices were abandoned for the more commonly known volatile memories, such as DRAMs (Dynamic Random Access Memories) and SRAMs (Static-RAMs).

The need for non-volatile memories never went away. Thus, in the last forty years, many devices were created to fulfill this need. In the late 70's, devices were made with a metallization layer which either connected or disconnected a cell. Thus, at the factory one could set values in a non-volatile way. Once these devices left the factory, they could not be re-written. They were called ROMs (Read Only Memories). In 1967, Khang and SZE at Bell Laboratories proposed devices which were made using field effect transistors (FETs) which had within layers of materials in the gate, the ability to trap charge. In the late 70's and early 80's, devices which could be written by the user and erased by de-trapping the electrons via ultra-violet light (UV) were very successful. The UV both required the device to be removed from the circuit board and placed under a UV lamp for over 15 minutes. These non-volatile memories were called PROMs or programmable ROMs. The writing process involved forcing current from the substrate below to these trap sites. This process of making the electrons pass through layers of materials which have an opposing potential energy barrier is known as quantum tunneling, a phenomenon that only occurs because of the wave-particle duality of the electron. Many types of sandwiches of materials for the gate stack of these FETs were tried, and the technology received many names such as MNOS (Metal-Nitride-Oxide-Semiconductor), SNOS ([Poly] Silicon-Gate Plus MNOS), SONOS (Silicon-Oxide Plus MNOS) and PS/O/PS/S (Polysilicon Control Gate—Silicon Dioxide—Polysilicon Floating Gate—and a thin tunneling oxide on top of the silicon substrate). This kind of erasable, and thus, read/write non-volatile device was known as EEPROMs for electrically-erasable-PROMs, an unfortunate misnomer since they are not just read only. Typically, EEPROMS have large cell areas and require a large voltage (from 12 to 21 volts) on the gate in order to write/erase. Also, the erase or write time is of the order of tens of microseconds. However, the worse limiting factor is the limited number of erase/write cycles to no more than slightly over 600,000—or of the order of $10^5$-$10^6$. The semiconductor industry eliminated the need of a pass-gate switch transistor between EEPROMs and non-volatile transistors by sectorizing the memory array in such a way that "pages" (sub-arrays) could be erased at a time in memories called Flash memories. In Flash memories, the ability to keep random access (erase/write single bits) was sacrificed for speed and higher bit density.

The desire to have low power, high speed, high density, and indestructibility has kept researchers working in non-volatile memory for the last forty years. FeRAMs (Ferroelectric RAMs) provide low power, high write/read speed, and endurance for read/write cycles exceeding 10 billion times. Magnetic memories (MRAMs) provide high write/read speed and endurance, but with a high cost premium and higher power consumption. Neither of these technologies reaches the density of Flash; thus, Flash remains the non-volatile memory of choice. However, it is generally recognized that Flash will not scale easily below 65 nanometers (nm); thus, new non-volatile memories that will scale to smaller sizes are actively being sought.

To this end, there has been much research over the last ten to twenty years on memories based on certain materials that exhibit a resistance change associated with a change of phase of the material. In one type of variable resistance memory called a PCM phase change memory), a change in resistance occurs when the memory element is melted briefly and then cooled to either a conductive crystalline state or a non-conductive amorphous state. Typical materials vary and include GeSbTe, where Sb and Te can be exchanged with other elements of the same properties on the Periodic Table. These materials are often referred to as chalcogenides. See, for example, Stephan Lai, "Current Status of the Phase Change Memory and Its Future", Intel Corporation, Research note RN2-05 (2005); U.S. Pat. No. 7,038,935 issued to Darrell Rinerson et al., May 2, 2006; U.S. Pat. No. 6,903,361 issued to Terry L. Gilton on Jun. 7, 2005; and U.S. Pat. No. 6,841,833 issued to Sheng Teng Hsu et al., Jan. 11, 2005. However, these resistance-based memories have not proved to be commercially useful because their transition from the conductive to the insulating state depends on a physical structure phenomenon, i.e., melting (at up to 600° C.) and returning to a solid state that cannot be sufficiently controlled for a useful memory.

Recently, a resistance switching field effect transistor has been disclosed using a Mott-Brinkman-Rice insulator, such as $LaTiO_3$. In this material, according to the theory proposed, the addition of holes via an interface with a $Ba_{(1-x)}Sr_xTiO_3$ layer changes the material from an insulator to a conductor. See U.S. Pat. No. 6,624,463 issued to Hyun-Tak Kim et al. on Sep. 23, 2003. This FET uses the Mott-Brinkman-Rice insulator as the channel in the FET. However, no example of fabrication of actual devices is given.

Another variable resistance memory category includes materials that require an initial high "forming" voltage and current to activate the variable resistance function. These materials include $Pr_xCa_yMn_zO_\epsilon$, with x, y, z and $\epsilon$ of varying stoichiometry; transition metal oxides, such as CuO, CoO, $VO_x$, NiO, $TiO_2$, $Ta_2O_5$; and some perovskites, such as Cr; $SrTiO_3$. See, for example, "Resistive Switching Mechanisms of $TiO_2$ Thin Films Grown By Atomic-Layer Deposition", B. J. Choi et al., *Journal of Applied Physics* 98, 033715 (2005); "Reproducible Resistive Switching In Nonstoichiometric Nickel Oxide Films Grown By RF Reactive Sputtering For Resistive Random Access Memory Applications", Jae-Wan Park, et al., *J. Vac. Sci. Technol.* A 23(5), September/October 2005; "Influence Of Oxygen Content On Electrical Properties Of NiO films grown By RF Reactive Sputtering", Jae-Wan Park, et al., *J. Vac. Sci. Technol.* B 24(5), September/October 2006; "Nonpolar Resistance Switching Of Metal/Binary-Transition-Metal Oxides/Metal Sandwiches: Homogeneous/inhomogeneous Transition of Current Distribution", I. H. Inone et al., *arXiv:Condmat/0702564* v.1, 26 Feb. 2007; and U.S. Patent Application Publication No. 2007/0114509 A1, *Memory Cell Comprising Nickel-Cobalt Oxide Switching Element*, on an application of S. Brad Herner. These memories are referred to as ReRAMs, to distinguish them from the chalcogenide type memories. These papers postulate that the resistance switching is due to the formation of narrow conducting paths or filaments connecting the top and bottom electrodes by the electroforming process, though the presence of such conducting filaments are still a matter of controversy. It is believed by Applicants that, when electroforming is used, the bulk of the non-filament region does not provide true memory switching but a metastable electron storage which is due to charge trapping and detrapping in oxygen vacancies. FIG. 19 is an Arrhenius curve of the log of 1/Tau versus 1/T(1/K) for prior art sputtered NiO illustrating the transition from the high resistance state to the low resistance state in this typical prior art resistive switching material is caused by detrapping of electrons from oxygen vacancies in the sputtered NiO. To generate this Arrhenius curve, the relaxation time for the material to return to the insulative state after SET, Tau, was measured for a number of temperatures in the working range of a proposed variable resistance memory (below 70° C.) for NiO films made by sputtering. As is known in the art, the slope of the Arrhenius curve 30 is proportional to the activation energy for the mechanism that is causing the relaxation. The slope found from curve 30 yields an activation energy of approximately 0.47 eV. This is essentially the activation energy for detrapping of electrons from oxygen vacancies in NiO. See "Surface Metallic Nature Caused By An In-Gap State Of Reduced NiO: A Photoemission Study", N. Nakajima et al., *Journal of Electron Spectroscopy and Related Phenomena*, 144 147 (2005) pp. 873-875. Thus, the variable resistance phenomenon of the prior art NiO devices is dominated by the trapping and detrapping of electrons in oxygen vacancies. Since trapping is strongly temperature dependent, such a resistive switching mechanism must also be highly temperature dependent; therefore, it cannot form the basis for a commercially useful memory. Similarly, all other prior art resistive switching materials exhibit unstable qualities. Further, the resistance switching tends to fatigue over many memory cycles. That is, after the memory state is changed many times, the resistance difference between the conducting and insulative states changes significantly. In a commercial memory, such a change would take the memory out of specification and make it unusable. Moreover, based on the ReRAM art to date, the use of such materials must be said to be speculative, since the high voltage-high current electroforming step simply is not compatible with dense chip architecture. In fact, the Herner patent application reference merely speculates that a combination of nickel and cobalt oxides will eliminate the required high amplitude pulses, without providing an actual example to demonstrate it.

In summary, there have been literally hundreds, if not thousands, of papers and patent applications written on resistive memories in the last ten years, most of which have been speculative. However, a workable resistance switching memory has never been made, because no one knows how to make a thin film resistance switching material that is stable over time and temperature. Further, all resistance switching mechanisms developed up to now have been inherently unsuitable for memories, due to high currents, electroforming, no measurable memory windows over a reasonable range of temperatures and voltages, and many other problems. Thus, there remains a need in the art for a non-volatile memory that has low power, high speed, high density and stability, and in particular, such a memory that is scalable to feature sizes well below 65 nanometers (nm).

BRIEF SUMMARY OF THE INVENTION

The invention solves the above and other problems by incorporating a Correlated Electron Material (CEM) in a memory, preferably a non-volatile memory. CEMs are materials that exhibit an abrupt conductor/insulator transition due to electron correlations rather than solid state structural phase changes, i.e., crystalline/amorphous or filamentary phase changes. Because these materials have never before been used in a memory, those skilled in the memory art are generally unfamiliar with them. Therefore, a more complete description of these materials will be given in the Detailed Description of the Invention below.

A feature of the invention is that the CEM materials are formed in the conductive state, and no forming voltage or current is necessary to change them into a variable resistance material.

Another feature of the preferred embodiment of the invention is that the correlated electron materials of the invention are essentially homogeneous. By "essentially homogeneous" is meant that the crystal structure is uniform through the bulk of the material, though there may be surface effects that create different structures at the surfaces than in the bulk. The term "essentially homogeneous" is intended to exclude the structure in which narrow filaments are formed which have different conducting properties than the rest of the film.

Another feature of the invention is that the conductor/insulator transition may be induced simply by the application of a small voltage or current to the material, i.e., a voltage of the order of the voltage applied to a DRAM, that is, no more than five volts and, more preferably, no more than a few volts.

The conductor/insulator transition in the memory according to the invention is a purely quantum mechanical phenomenon, in contrast to melting/solidification or filament formation, which are classical physics phenomena. The quantum mechanical transition can be understood in several ways. One way is in terms of band structure. When the materials are formed, the relevant electron orbitals, i.e., the bands that are being filled by the increasing electrons in each succeeding element in the Periodic Table, overlap. In the transition metal oxides, these are d-orbitals. This creates a partially-filled double band that is conductive in the same way that a metal is conductive. When a small voltage or current is applied, mobile electrons are added to the bands. When the bands become full enough that the coulomb repulsion becomes great enough, the partially filled bands split, with the filled p-orbital between them. This creates a filled band and an empty band separated by a significant energy, which is the band structure for a Mott-charge transfer insulator (See FIG. 14). When the electric field applied to the material becomes large enough to cause a transition between the split orbitals, electrons begin to jump from the lower band to the upper band, which reduces the coulomb repulsion, causing the correlated electron system to collapse back into the original state in which the orbitals overlap. The quantum mechanical transition can also be understood in terms of a Mott transition. In a Mott transition, a material switches from a paramagnetic conductive state to an anti-ferromagnetic insulative state when the Mott transition condition $(n_C)^{1/3}a=0.26$ is reached, where $n_C$ is the concentration of electrons and "a" is the Bohr radius. This is sometimes explained as a "crowded elevator" phenomenon: when an elevator has only a few people in it, the people can move around easily, which is analogous to the conducting state; but when the elevator reaches a certain concentration of people, the people can no longer move, which is analogous to the insulative state. However, it should be understood that this classical explanation, like all classical explanations of quantum phenomenon, is only an incomplete analogy. In the Mott transition, the spins of the electrons also play a significant role. In the paramagnetic state, the spins are disordered, while in the anti-ferromagnetic state, the spins are anti-aligned; that is, the spins of electrons align in a regular pattern with neighboring spins pointing in opposite directions.

The invention provides a resistive switching integrated circuit memory comprising: a resistive switching memory cell including a correlated electron material (CEM); a write circuit for placing the resistive switching memory cell in a first resistive state or a second resistive state depending on information input into the memory, wherein the resistance of the CEM is higher in the second resistance state than in the first resistance state; and a read circuit for sensing the state of the memory cell and providing an electrical signal corresponding to the sensed state of the memory cell. Preferably, the CEM is essentially homogenous. Preferably, the memory is capable of being read $10^8$ times with less than 50% fatigue. Preferably, the memory has a memory window that changes less than 50% over a temperature range of from minus 50° C. to 75° C. Preferably, the resistance of the CEM in the second memory cell state is more than 100 times the resistance in the second memory cell state, and, more preferably, 200 times. Preferably, the CEM switches resistive states due to a Mott-transition in the majority of the volume of the CEM. Preferably, the CEM comprises a material selected from the group consisting of aluminum, cadmium, chromium, cobalt, copper, gold, iron, manganese, mercury, molybdenum, nickel, palladium, rhenium, ruthenium, silver, tin, titanium, vanadium, and zinc, which preferably is linked to a cation such as oxygen or other types of ligands. Preferably, the memory is a non-volatile memory. Preferably, the memory is a random access memory. Preferably, the memory is a cross-tie memory. Preferably, the memory comprises a plurality of the memory cells arranged in rows and columns. Preferably, the memory cells comprise a metal/CEM/metal (M/CEM/M) stack formed on a semiconductor. Preferably, the M/CEM/M stack is formed on a diode. Here, as is conventional in the art, "metal" means a conductor, that is, any material that acts like a metal, including, for example, polysilicon or a doped semiconductor. Preferably, the diode is selected from the group consisting of a junction diode and a Schottky diode.

The invention also provides a method of forming a resistive switching memory, the method comprising: providing a substrate; forming a transition metal oxide on the substrate by crystallizing it directly into a conducting state without an electroforming process; and completing said memory to include said transition metal oxide in an active element in said memory. Preferably, the forming comprises a liquid deposition process. Preferably, the forming comprises an anneal.

In a further aspect, the invention provides a method of writing to a resistive switching thin film memory element, the method comprising applying an electric field or voltage to the thin film to cause the concentration of electrons, $n_c$, in an energy band in the majority of the volume of the material to increase to or greater than a value given by $(n_C)^{1/3}a=0.26$ where "a" is the Bohr radius.

In yet another aspect, the invention provides a method of making a non-volatile integrated circuit memory, the method comprising: depositing an essentially homogeneous correlated electron material (CEM); and completing the memory to include the CEM in an active element in the memory. Preferably, the depositing comprises a process selected from the group consisting of: a chemical solution deposition (CSD) process; depositing a metal and oxidizing it; and sputtering.

In addition, the invention provides a method of writing to a non-volatile, resistive switching thin film memory element, the method comprising: providing a memory cell including an essentially homogeneous thin film of correlated electron material (CEM); and applying an electric field or voltage to the thin film to cause the concentration of electrons, $n_C$, in an energy band in the majority of the volume of the material to increase to or greater than a value given by $(n_C)^{1/3}a=0.26$ where "a" is the Bohr radius.

The invention provides denser memory arrays and faster program and erase cycles, such as by eliminating reliance upon hot carrier injection and Fowler-Nordheim tunneling from the silicon substrate as in the conventional Flash memory. Further, the invention provides a non-volatile memory with lower voltage program and erase cycles than prior art memories such as Flash, thereby enabling lower power operation. The invention also provides higher endurance of program and erase cycles, for example, by eliminating breakdown of gate oxide used as a tunneling oxide in Flash memory. The invention also provides continued scaling of the memory element, such as by eliminating programming via tunneling from the substrate and being affected by the deleterious aspects of shrinking channel length. Numerous other features, objects, and advantages of the invention will become apparent from the following description when read in conjunction with the accompanying drawings.

BRIEF DESCRIPTION OF THE DRAWINGS

FIG. 15 is a cross-sectional view of a 1 transistor/1 resistor CEM switching cell according to the invention;

FIG. 16 illustrates an exemplary memory utilizing any of the memory cells disclosed herein;

DETAILED DESCRIPTION OF THE INVENTION

Figure 1:
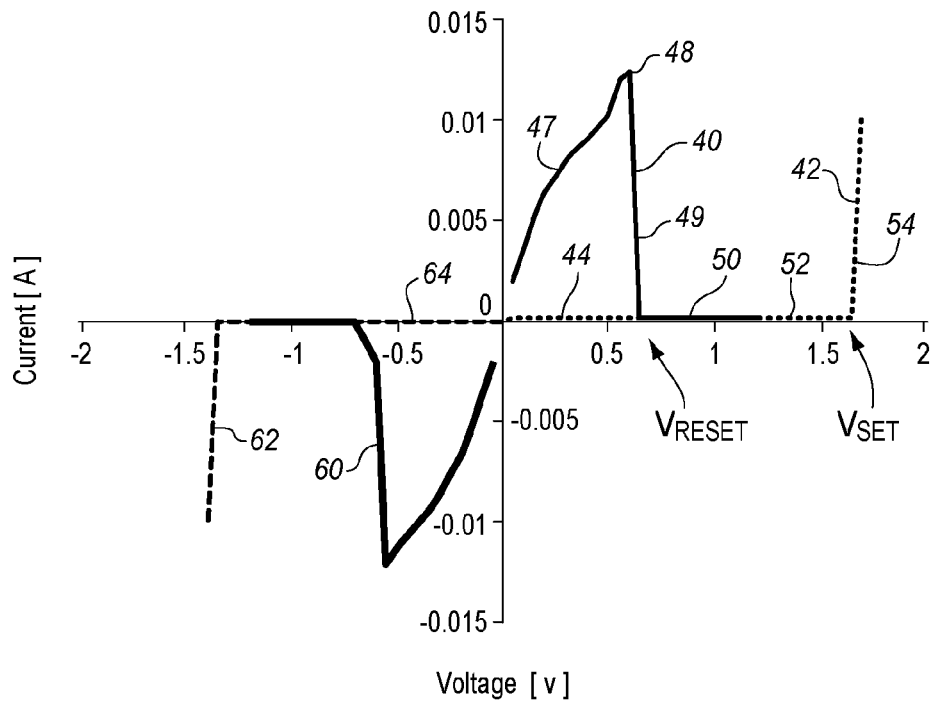
FIG. 1 shows the current in amperes versus bias voltage in volts curves for an NiO resistor according to the invention.

The variable resistance materials discussed herein are Correlated Electron Materials. A Correlated Electron Material (CEM) is a material that switches from a first resistive state to a second resistive state, with the second resistive state having a resistance at least one hundred times higher than the first resistance state, and the change in resistance being primarily due to electron correlations. Preferably, the CEM material changes from a paramagnetic conductive state to an anti-ferromagnetic insulative state when the Mott transition condition $(n_C)^{1/3}a=0.26$ is reached, where $n_C$ is the concentration of electrons and "a" is the Bohr radius. More preferably, the resistance of the second state is at least two hundred times the resistance of the first state, and most preferably, five hundred times. Generally, these materials include any transition metal oxide, such as perovskites, Mott insulators, charge exchange insulators, and Anderson disorder insulators. Several embodiments representing switching materials are nickel oxide, cobalt oxide, iron oxide, yttrium oxide, and perovskites such as Cr doped strontium titanate, lanthanum titanate, and the manganate family including praesydium calcium manganate, and praesydium lanthanum manganate. In general, oxides incorporating elements with incomplete d and f orbital shells exhibit CEM resistive switching properties. Preferably, resistance can be changed by setting at one voltage and resetting at a second voltage. Preferably, no electroforming is required to prepare a CEM. The invention contemplates that many other transition metal compounds can be used in the invention. For example, $\{M(chxn)_2Br\}Br_2$ where M can be Pt, Pd, or Ni, and chxn is 1R,2R-cyclohexanediamine, and other such metal complexes may be used.

It is a feature of the invention that the conduction of the CEM materials is area independent. That is because the conduction is a quantum mechanical phenomenon and is related to the transition probability through the film. This conduction, G, is given by:

$$G=(q^2 \varrho_m \varrho_{NiO}/hm)T,$$

where q is the electron charge, $\varrho_m$, is the density of states in the electrode, $\varrho_{NiO}$ is the density of states in the nickel oxide, m is the mass of the charge carrier, and T is the transmission probability through the film.

The present disclosure provides examples of CEM materials that are transition metal oxide variable resistance materials, though it should be understood that these are exemplary only, and are not intended to limit the invention. The invention is applicable to other variable resistance materials as well. Nickel oxide, NiO, is disclosed as the exemplary transition metal oxide. The NiO materials discussed herein are doped with extrinsic ligands, which stabilize the variable resistance properties. In particular, the NiO variable resistance materials disclosed herein include a carbon containing ligand, which may be indicated by $NiO(C_x)$. One skilled in the art can determine the value of x for any specific carbon containing ligand and any specific combination of carbon containing ligand with NiO simply by balancing valences.

The present disclosure provides transition metal oxides as exemplary correlated electron materials, though the invention is applicable to other CEM materials as well. Nickel oxide, NiO, is disclosed as the exemplary transition metal oxide. The exemplary NiO materials discussed herein are doped with extrinsic ligands, which stabilize the variable resistance properties. In general, this may be written as $NiO(L_x)$, where $L_x$ is a ligand element or compound and x indicates the number of units of the ligand for one unit of NiO. One skilled in the art can determine the value of x for any specific ligand and any specific combination of ligand with NiO or any other transition metal simply by balancing valences. The preferred NiO variable resistance materials disclosed herein include at least a carbon ligand, which may be indicated by $NiO(C_x)$.

Figure 2:
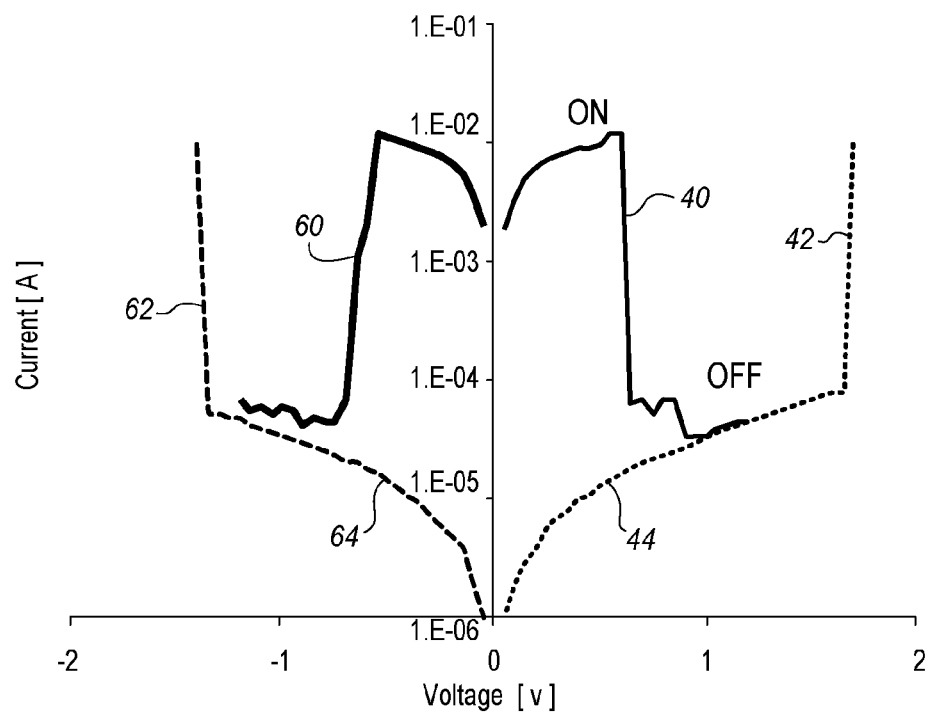
FIG. 2 shows the same curves as shown in FIG. 1 except on a logarithmic scale which shows higher resolution at the smaller values of current.

FIG. 1 shows the current in amperes (amps) versus bias voltage in volts curves for an $NiO(C_x)$ CEM according to the invention. FIG. 2 shows the same curves except the absolute value of the current is plotted logarithmically to show more detail in the low current values. As has become the nomenclature in the art, the point at which the CEM changes in resistance from a conductor to an insulator is called the RESET point, while the point at which the resistance changes from an insulator to a conductor is called the SET point. Unlike other variable resistance materials, the CEMs are born conductive. We shall refer to this as the ON state, and the insulative state will be called the OFF state. The solid line 40 is the ON state curve for positive voltages, and the solid line 60 is the ON curve for negative voltages. The dotted line 54 is the OFF curve for positive voltages, while the dotted line 62 is the OFF curve for negative voltages. As the voltage is increased, the current rises at 47, until the RESET voltage is reached, which is about 0.65 volts, which is also the point at which critical electron density is reached; then, at point 48, the material suddenly becomes insulative and the current drops sharply along curve 49. The current stays low along the line 52 as the voltage rises until the SET voltage is reached at about 1.65 volts, which corresponds to the Neel temperature for these materials, at which point the material again becomes conductive and the current rises along line 54. If the voltage is returned to zero and then raised again when the CEM is in the insulative state, the current follows the line 44, while, if the voltage is returned to zero after the material becomes conducting, that is after the $V_{SET}$ point, the current follows the line 47. It is evident from FIGS. 1 and 2 that the write memory window exists between $V_{RESET}$ and $V_{SET}$, while the read memory window exists between the ON and OFF state current level. It is also evident from FIGS. 1 and 2 that these memory windows are easily large enough for a viable commercial memory.

Figure 3:
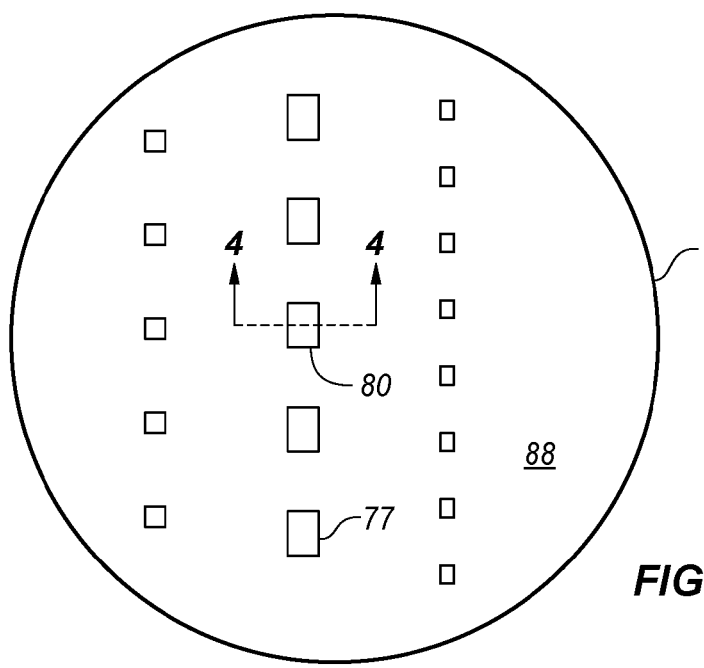
FIG. 3 illustrates a silicon wafer with CEM "elements" comprising a CEM material according to the invention sandwiched between two electrodes.
Figure 4:
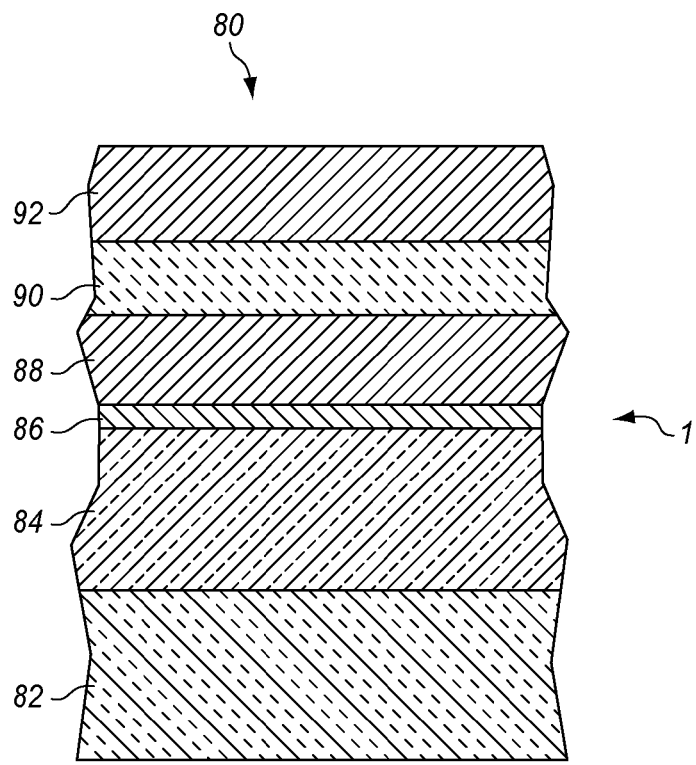
FIG. 4 shows a cross-sectional view of one of the "elements" of FIG. 3 taken through the line 4-4 of FIG. 3.

Turning now to FIGS. 3 and 4, a silicon wafer 1 having CEM integrated circuit elements, such as 77 and 80, formed on it is shown. FIG. 4 shows a cross-section through element 80 taken through line 4-4 of FIG. 3. Element 80 is formed on a silicon substrate 82 having a silicon dioxide coating 84. Optionally, a thin layer 86 of titanium or titanium oxide may be formed on oxide layer 84, though the elements reported on herein did not have such a layer. A layer 88, preferably of platinum, is formed on either layer 86 or directly on oxide layer 84. Layer 86 is an adhesion layer to assist the platinum in adhering to silicon dioxide layer 84. CEM material 90 is formed on platinum bottom electrode 88, preferably by a liquid deposition process, such as spin coating, misted deposition, CVD, or atomic layer deposition. Top electrode 92, preferably platinum, then is formed on CEM layer 90. The elements 77, 80, etc. then are patterned by etching down to bottom electrode 88. The various elements 77, 88 then can be tested by attaching one probe to platinum surface 88 and touching a fine probe to the top electrode, such as 92, of the element to be tested, such as 80. The curves of FIGS. 1 and 2, as well as the curves discussed below, were generated in this manner.

It should be understood that figures such as FIGS. 3, 4, and 15 depicting integrated circuit devices are not meant to be actual plan or cross-sectional views of any particular portion of actual integrated circuit devices. In actual devices, the layers will not be as regular and the thicknesses may have different proportions. The various layers in actual devices often are curved and possess overlapping edges. Instead, the figures show idealized representations which are employed to explain more clearly and fully the method of the invention than would otherwise be possible. Also, the figures represent only one of innumerable variations of devices that could be fabricated using the designs and methods of the invention. As is conventional in the art, the term "metal" when referring to an electrode or other wiring layer generally means a conductor. As is known in the art, such "metal" electrodes and/or wiring layers can be made of polysilicon or other conductive material and are not necessarily made of metal.

Figure 5:
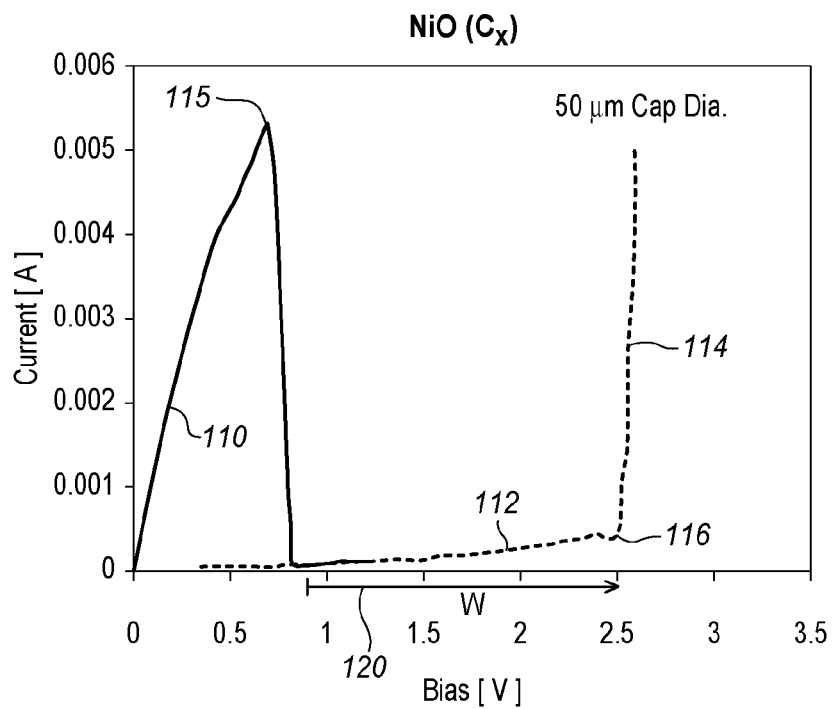
FIG. 5 is a graph of voltage versus current illustrating the SET and RESET functions for an NiO element having a diameter of 50 microns.
Figure 6:
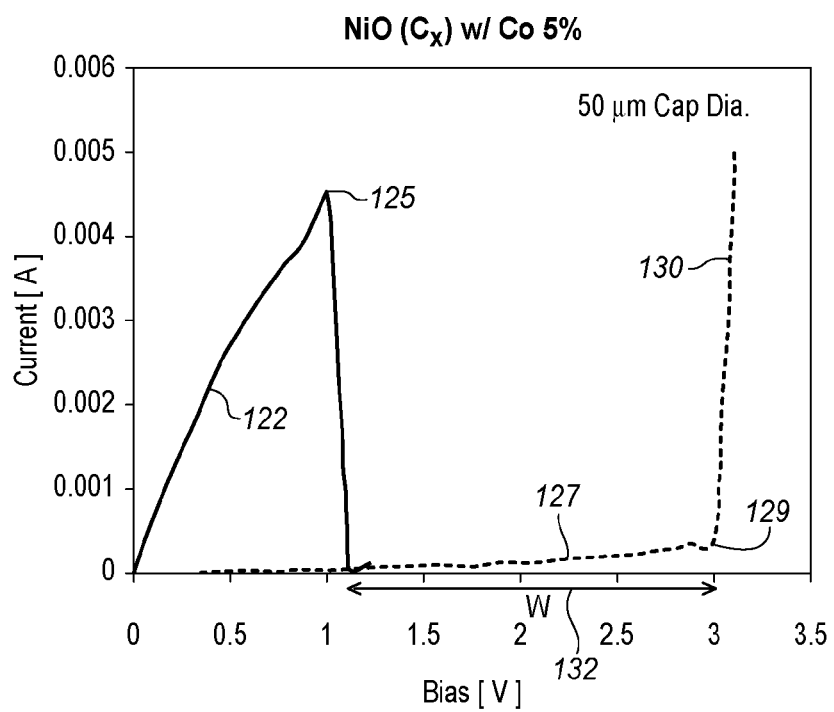
FIG. 6 is a graph of voltage versus current illustrating the SET and RESET functions for an NiO element with the CEM material doped with 5% cobalt and having a diameter of 50 microns.

FIG. 5 is a graph of voltage versus current illustrating the SET and RESET functions for a NiO capacitor having a diameter of 50 microns, and FIG. 6 is a graph of voltage versus current illustrating the SET and RESET functions for a NiO capacitor doped with 5% cobalt and having a diameter of 50 microns. FIG. 5 is similar to the curve of FIG. 1 discussed above and is presented to facilitate comparison with FIG. 6. The general shape of the ON curves 110 and 122 and 114 and 130 remain essentially the same, as do the shape of the OFF curves 112 and 127. When comparing the curves of FIGS. 31 and 32, it is observed that the RESET point 115 for the NiO($C_x$) CEM is at about 0.8 volts, while the RESET point 125 of the CEM doped with cobalt is about 1.15 volts. Further, the SET point 116 for the NiO($C_x$) CEM is at about 2.5 volts, while the SET point 129 of the CEM doped with cobalt is about 3 volts. Further, the width W of window 120 is about 1.75 volts, while the width W of window 132 is about 1.85 volts. Thus, the onset of the insulative state has shifted, with the overall window W widening. These figures indicate that, with selective doping, the onset of the states and the width of the voltage window can be adjusted.

Figure 7:
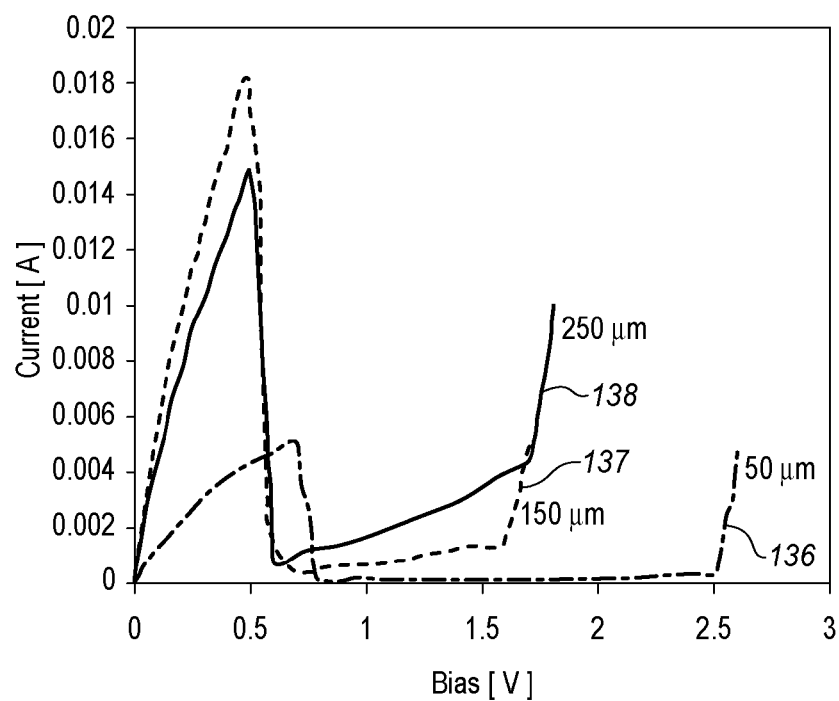
FIG. 7 show graphs of voltage versus current illustrating the SET and RESET functions for three NiO elements having different diameters, illustrating how the memory window changes with element diameter.
Figure 8:
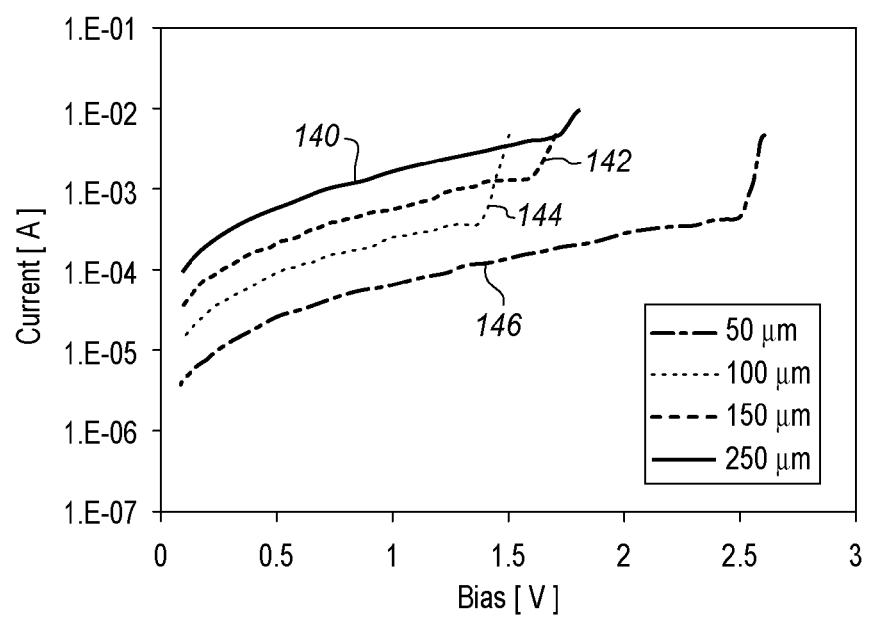
FIG. 8 show graphs of voltage versus current in the high resistance state for four NiO sandwiches having different diameters.
Figure 9:
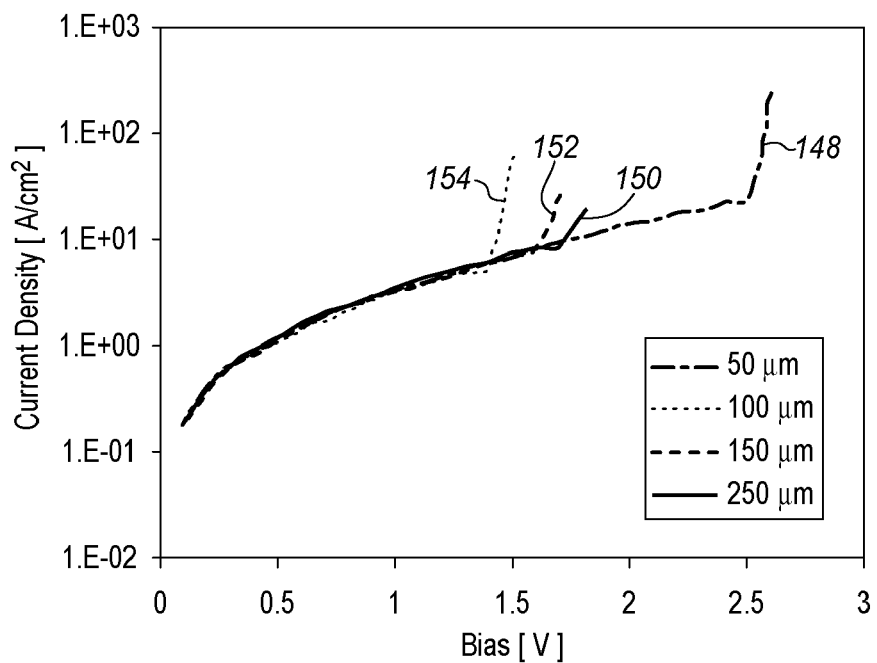
FIG. 9 show graphs of voltage versus current density in the high resistance state for the four elements of FIG. 8.

FIG. 7 show graphs 136, 137, and 138 of voltage versus current illustrating the SET and RESET functions for three NiO sandwich elements having diameters of 50 microns, 150 microns, and 250 microns, respectively, illustrating how the memory window changes with element diameter. FIG. 8 show graphs 140, 142, 144, and 146 of voltage versus current in the high resistance state for four NiO sandwich elements having diameters of 250 microns, 150 microns, 100 microns, and 50 microns, respectively; and FIG. 9 show graphs 148, 150, 152, and 154 of voltage versus current density in the high resistance state for the four elements, respectively, of FIG. 8.

Figure 10:
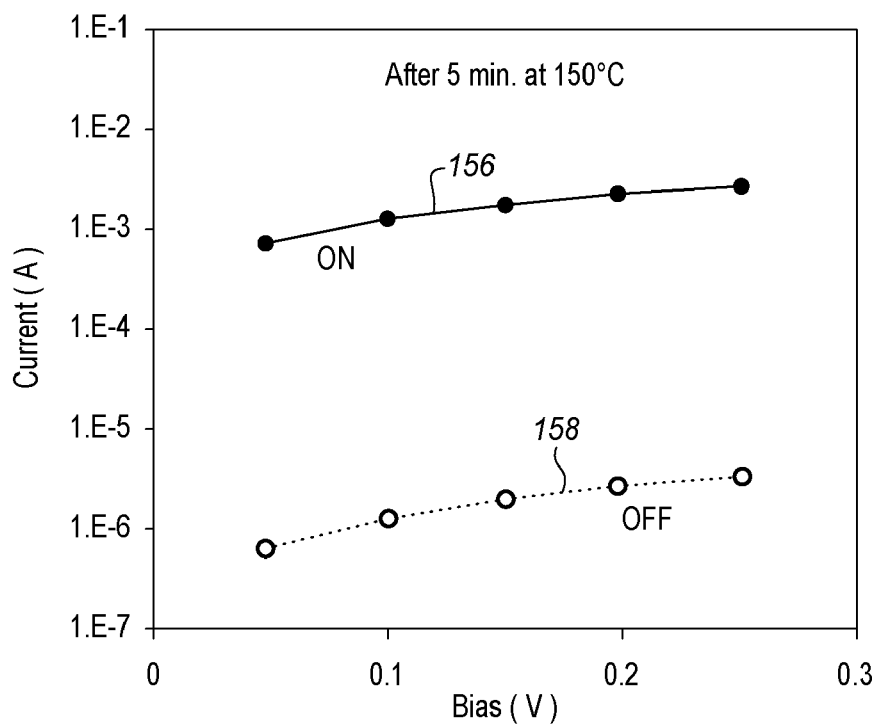
FIG. 10 shows a graph of current in amps versus bias voltage in volts for the ON and OFF states after the NiO CEM was held at 150° C. for five minutes.
Figure 11:
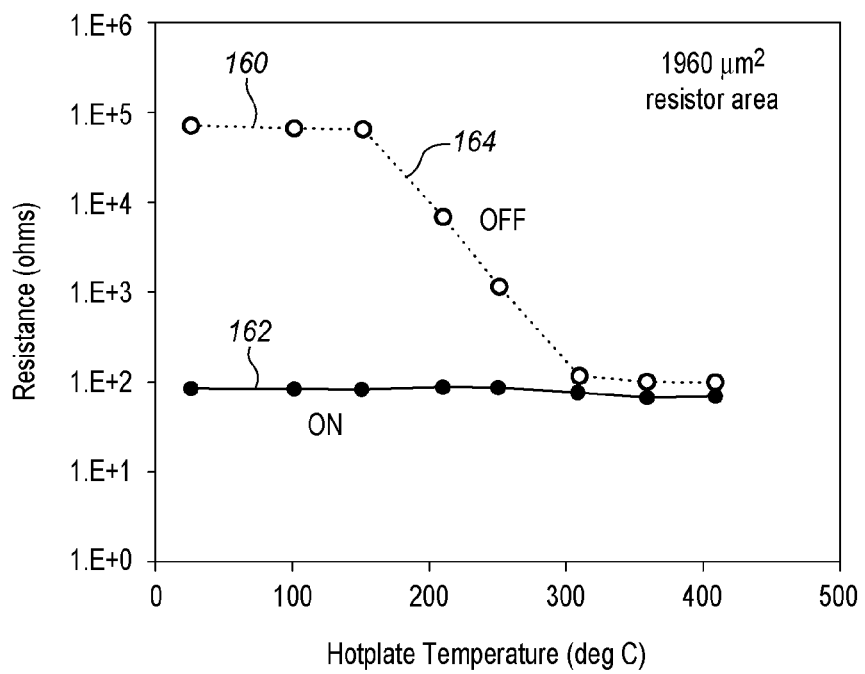
FIG. 11 shows a graph of resistance in Ohms versus temperature in degrees centigrade for the ON and OFF states, illustrating the stability of these states at higher temperatures.

FIG. 10 shows a graphs of current in amps versus bias voltage in volts after the NiO correlated electron material was held at 150° C. for five minutes. This graph shows no degradation of the ON state 156 or OFF state 158, indicating the temperature stability of the resistance change phenomenon according to the invention. FIG. 11 shows a graph of resistance in Ohms versus hot plate temperature in degrees centigrade. To generate this curve, the CEM elements were placed on a hot plate and heated to the temperature shown. This graph shows that the OFF state 160 degrades above 150° C., as shown by the declining curve 164, but the ON state 162 did not degrade. Above 410° C., switching ability was not regained for the OFF state and was regained only with difficulty of the ON state. This graph demonstrates that memories made with the CEM material according to the invention should be stable at all reasonable temperatures.

Figure 12:
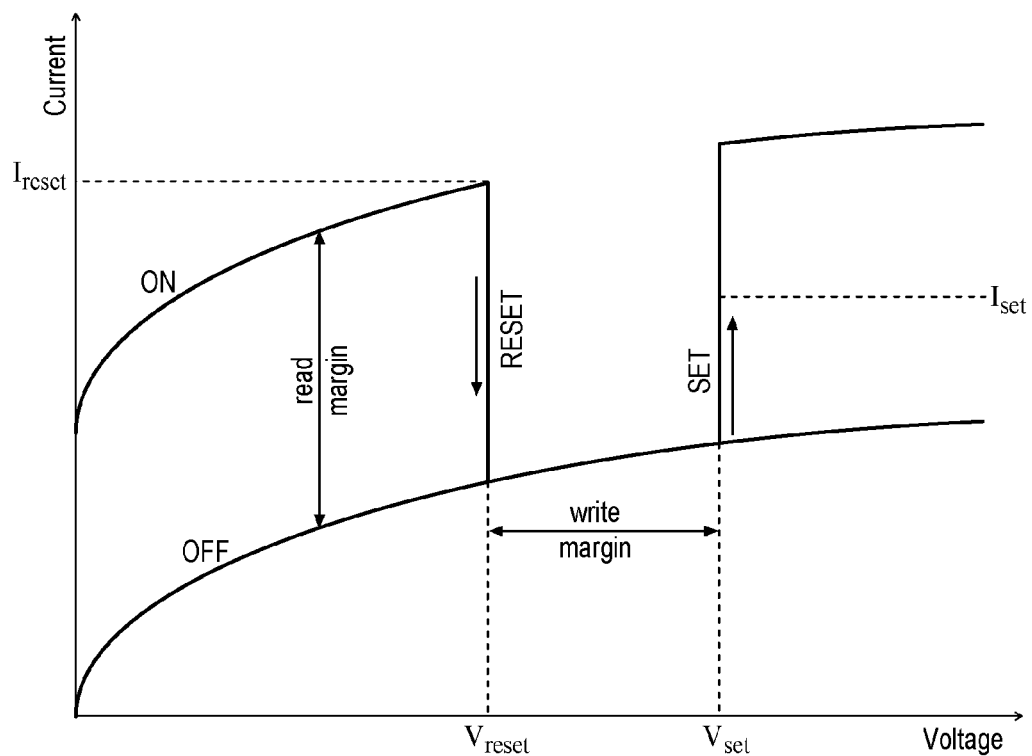
FIG. 12 shows an idealized current versus voltage curve for a resistive switching film with unipolar switching, illustrating the ON, OFF, RESET, and SET modes.

FIG. 12 shows an idealized current versus voltage for a resistive switching film with unipolar switching, to better illustrate the ON, OFF, RESET, and SET modes. The material is crystallized in the ON state, and the current rises along the ON curve as voltage is increased up to $V_{RESET}$. The current then drops to the OFF curve and increases gradually along the OFF curve until $V_{SET}$ is reached, at which point it increases toward the ON curve. However, in devices, the current is limited by the dotted line, $I_{set}$ to prevent overcurrent. The read and write margins are shown in the figure. As shown by FIGS. 6 and 7, the NiO($C_x$) films according to the invention follow these idealized curves better than any prior art material.

The CEMs are typically oxides formed from elements that have a partially filled $3d$ band and materials with partially filled $3f$ bands in the Periodic Table. The most well known of these oxides are vanadium oxide and nickel oxide. The materials with partially filled $3d$ bands or partially filled $3f$ bands are sometimes described also as Metal/Insulator phase transition materials. However, such metallic to insulator transition can also occur in combining transition metals with other materials of systems such as sulfides, iodines, tellurides, and others that do not involve oxygen. In all such materials, which includes groups IIIB up to and including group IIB (from column three to twelve across the Periodic Table—for half filled $3d$ materials, and the elements 57 to 71 and 89 to 103 for the half filled $3f$ band), clear description of the electronic bands is still lacking due to the strong coulombic correlation between electrons. However, it is well known that narrow $3d$ and narrow $3f$ orbitals cause strong electron correlations. It is disclosed herein that such correlations are responsible for a switching mechanism that can be voltage or current activated. It is this switching action that is used in the present invention, though this action is used in two different modes. For understanding the invention, it is important to separate this switching process which is triggered by a critical electron population from other switching processes, such as solid state phase changes. Herein, we shall refer to materials which employ the above-described switching process as "Correlated Electron Materials" (CEMs) and the basic unit of electrode/CEM/electrode as a "Mott-Bardeen Switch" (MBS). The easiest conceptual description of such materials is that, in the insulating state, the interaction energy between electrons is so strong that the effective mass (m*) is much heavier than the electron mass in the electron gas phase, which is known as the Rice-Brickman description. Thus, a switch between masses (caused by the overlap of the electron wave functions in 3$d$ sub-bands or 3$f$ sub-bands) at a certain operational voltage sets the state of the material from insulator to metal (and vice-versa) by increasing or decreasing the interaction energy relative to the energy gap. In the past, such change in the electron mass was attained mainly by a change in temperature; and these materials were studied for their thermodynamic properties, implying a change in physical structure. However, as explained herein, the electronic transitions due to correlated electrons occur at room temperature or over a useful temperature region for device operation, and in both polarities of the applied voltage. Thus, when the term "phase change" is used herein with respect to a CEM, it relates to the change of an electronic phase. Also, the transition causes a hysteresis of the current versus voltage characteristic yielding two resistive states which are stable for an undetermined period of time producing a non-volatile memory behavior. Such memories are quite promising because not only are they non-volatile, but the electronic phase change is resistant to radiation damage and the memories can be made very dense.

It is also defined herein that a CEM with a single conducting electrode and the other surface contacted to an insulator or another CEM will be called "Metal/CEM Bardeen Barrier" or an "MCB barrier", perhaps better described by what is known in the literature as a "Bardeen Transfer Hamiltonian" which, when used with different effective mass tensors across the metal to CEM barrier, with or without the aid of vacancies, describes well the metal to CEM tunneling with an effective mass switch occurring as the electron enters the CEM from the common metal electrode, and an electronic phase transition is caused which produces the switching action. Whether the theoretical descriptions are referring to a change in effective mass or opening and closing of sub-bands in the density of states of the CEM, the utility of the switching action and the stability of the final state (metal or insulating) and the control of such action is the central point of the invention for non-volatile memories applications.

In the preferred CEM described herein, extrinsic ligand-forming dopants are added to the transition metal compounds. However, it should be understood that correlated electron switching can occur in materials other than materials including ligands. The extrinsic ligands stabilize the metals in the compounds to a stable valence state. With such stabilization, electroforming is no longer necessary. Herein, "stabilized" means with respect to both time and temperature. In particular, it means that the electrical properties critical to reliable memory operation, including the RESET voltage, the SET voltage, and the memory window, i.e., the resistance between the non-conducting and conducting states, does not change more than thirty percent over operational time period and temperature range, i.e., over a time period of three years, and more preferably, five years, and most preferably, ten years, and a temperature range from 0° C. to 60° C., more preferably from −20° C. to 80° C., and most preferably from −50° C. to 100° C. More preferably, these electronic parameters do not change more then twenty-five percent, and most preferably, they do not change more than twenty percent.

Some ligands may be less useful than others because they are not stabilizing under all circumstances. Preferably, the invention utilizes ligands that stabilize the orbital valence states, and particularly the 3$d$ orbital states. For example, the complex $[Ti(H_2O)_6]^{3+}$ is not stabilizing for conventional CMOS processing because, when it is annealed, the water evaporates leaving uncompensated titanium, which can take many different valence states. Such a material likely will require electroforming.

Some useful ligands for various metals are shown in Table 1. In this table, the metal of interest is given in bold, followed by the formula for the complex it forms with the ligand of interest.

TABLE 1

Aluminum $[Al(OH)_4]^-$
$[AlF_6]^{3-}$
Cadmium $[Cd(CN)_4]^{2-}$
cis-$Cd(NH_3)_4Cl_2$
trans-$Cd(NH_3)_4Cl_2$
Chromium $Cr(acac)_3$
$[Cr(CN)_6]^{4-}$
$[Cr(en)_3]^{3+}$
$[CrF_6]^{4-}$
$[Cr(NH_3)_6]^{3+}$
$[Cr(OH_2)_6]^{3+}$
$[CrO_4]^{2-}$
cis-$Cr(acac)_2(OH_2)_2$
trans-$Cr(acac)_2(OH_2)_2$
cis-$[Cr(NH_3)_4Cl_2]^+$
trans-$[Cr(NH_3)_4Cl_2]^+$
$[Cr(NH_3)_5Br]^{2+}$
$[Cr(NH_3)_5Cl]^{2+}$
$[Cr(NH_3)_5(OSO_3)]^+$
cis-$[Cr(OH_2)_4Cl_2]^+$
trans-$[Cr(OH_2)_4Cl_2]^+$
$[Cr(OH_2)_5Br]^{2+}$
$[Cr(OH_2)_5Cl]^{2+}$
$[Cr_2O_7]^{2-}$
Cobalt $[CoBr_4]^{2-}$
$[CoBr_6]^{4-}$
$[CoCl_4]^{2-}$
$[Co(CN)_6]^{3-}$
$[Co(en)_3]^{3+}$
$[CoF_6]^{3-}$
$[Co(NH_3)_6]^{2+}$
$[Co(NH_3)_6]^{3+}$
$[Co(OH_2)_6]^{2+}$
$[Co(O_3C)_3]^{3-}$
Cis-$[Co(en)_2Cl_2]^+$
trans-$[Co(en)_2Cl_2]^+$
cis-$[Co(OH_2)_4(SCN)_2]^+$
trans-$[Co(OH_2)_4(SCN)_2]^+$
cis-$[Co(NH_3)_4Cl_2]^+$
trans-$[Co(NH_3)_4Cl_2]_+$
cis-$Co(NH_3)_4(NO_2)_2$
trans-$Co(NH_3)_4(NO_2)_2$
cis-$Co(NH_3)_4(ONO)_2$
trans-$Co(NH_3)_4(ONO)_2$
cis-$[Co(ox)_2(OH_2)_2]^-$
trans-$[Co(ox)_2(OH_2)_2]^-$
cis-$[Co(en)_2(NO_2)Cl]^+$
trans-$[Co(en)_2(NO_2)Cl]^+$
$[Co(NH_3)_5Cl]^{2+}$
$[Co(NH_3)_5(NO_2)]^{2+}$
cis-$[Co(NH_3)Br(en)_2]^{2+}$
trans-$[Co(NH_3)Br(en)_2]^{2+}$
Copper $[Cu(CN)_2]^-$
$[Cu(NH_3)_4]^{2+}$
$[Cu(OH_2)_6]^{2+}$
cis-$[Cu(en)_2(OH_2)_2]^{2+}$
trans-$[Cu(en)_2(OH_2)_2]^{2+}$ TABLE 1-continued Gold

[Au(CN)$_2$]$^-$
Iron

[Fe(Cl$_4$)]$^-$
[Fe(CN)$_6$]$^{3-}$
[Fe(CN)$_6$]$^{4-}$
Fe(CO)$_5$
[Fe(EDTA)]$^{2-}$
[Fe(en)$_3$]$^{3+}$
[Fe(OH$_2$)$_6$]$^{2+}$
[Fe(OH$_2$)$_6$]$^{3+}$
[fe(ox)$_3$]$^{3-}$
[Fe(SCN)$_6$]$^{3-}$
cis-[Fe(en)$_2$(NO$_2$)$_2$]$^+$
trans-[Fe(en)$_2$(NO$_2$)$_2$]$^+$
[Fe(OH)(OH$_2$)$_5$]$^{2+}$
Manganese

[MnCl$_6$]$^{4-}$
[Mn(CN)$_6$]$^{3-}$
[Mn(CN)$_6$]$^{4-}$
[Mn(en)$_3$]$^{2+}$
[Mn(OH$_2$)$_6$]$^{2+}$
[MnO$_4$]$^-$
Mercury

[HgS$_2$]$^{2-}$
[HgCl$_3$]$^-$
[HgI$_4$]$^{2-}$
Molybdenum

[MoO$_4$]$^{2-}$
Nickel

[NiBr$_4$]$^{2-}$
[Ni(CN)$_4$]$^{2-}$
Ni(CO)$_4$
[Ni(en)$_3$]$^{2+}$
[Ni(NH$_3$)$_4$]$^{2+}$
[Ni(NH$_3$)$_6$]$^{2+}$
[Ni(OH$_2$)$_6$]$^{2+}$
[Ni(ox)$_2$]$^{2-}$
[Ni(penten)]$^{2+}$
cis-Ni(en)$_2$Cl$_2$
trans-Ni(en)$_2$Cl$_2$
Palladium

[PdCl$_4$]$^{2-}$
Platinum

[PtCl$_4$]$^{2-}$
[PtCl$_6$]$^{2-}$
[PtCl$_6$]$^{4-}$
[PtI$_4$]$^{2-}$
[PtI$_6$]$^{2-}$
[Pt(NH$_3$)$_4$]$^{2+}$
Pt(en)Cl$_2$
cis-Pt(NH$_3$)$_2$Cl$_2$
trans-Pt(NH$_3$)$_2$Cl$_2$
cis-Pt(NH$_3$)$_2$Cl$_4$
trans-Pt(NH$_3$)$_2$Cl$_4$
Pt(NH$_3$)$_2$(ox)
[Pt(NH$_3$)$_3$Br]$^+$
trans-[Pt(NH$_3$)$_4$Cl$_2$]$^{2+}$
cis-[Pt(NH$_3$)$_4$Cl$_2$]$^{2+}$
cis-[Pt(NH$_3$)$_4$I$_2$]$^{2+}$
trans-[Pt(NH$_3$)$_4$I$_2$]$^{2+}$
Rhenium

[ReO$_4$]$^-$
Rhodium

[RhCl$_6$]$^{3-}$
[RhI$_2$(CO)$_2$]$^-$
cis[Rh(phen)$_2$Cl$_2$]$^+$

TABLE 1-continued

Ruthenium

[Ru(NH$_3$)$_6$]$^{2+}$
[Ru(phen)$_3$]$^{2+}$
[Ru(NH$_3$)$_5$Cl]$^{2+}$
Silver

[Ag(S$_2$O$_3$)$_2$]$^{3-}$
[Ag(NH$_3$)$_2$]$^+$
Tin

[SnCl$_6$]$^{2-}$
[Sn(OH)$_6$]$^{2-}$
[Sn(OH)$_3$]$^-$
Titanium

[TiO]$^{2+}$
Vanadium

[V(en)$_3$]$^{3+}$
[VO]$^{2+}$
[VO$_2$]$^+$
[VOCl$_4$]$^{2-}$
Zinc

[Zn(CN)$_4$]$^{2-}$
[Zn(NH$_3$)$_4$]$^{2+}$

Based on the above discoveries, Applicants have, for the first time, applied ligand field theory to the understanding of a resistance switching mechanism in transition metal compounds. Ligand field theory was developed in the 1930's and 1940's as an extension of crystal field theory. See, for example, "Ligand Field Theory" in Wikepedia, the free encyclopedia at http://en.wikipedia.org/wik/Ligand_field theory, which is incorporated by reference herein to the same extent as though fully disclosed herein. As explained therein, the energy difference between certain molecular orbitals (MO's) is called $\Delta_0$, where the "O" stands of octahedral. This size of this energy difference, $\Delta_0$, determines the electronic structure of d orbitals. Applicants have found that, in the thin-film regime used in the fabrication of the devices according to the invention, the stability of the memory window between the OFF state and the ON state is substantially proportional to the stability of $\Delta_0$. Thus, the preferred dopant ligands are those which result in a large and stable $\Delta_0$. Some useful dopant ligands in descending order of the size of the $\Delta_0$ they create are: CO, CN$^-$, PPh$_3$, NO$_2^-$, phen (1,10-phenanthroline, biby (2,2'-bipyridine), en (enthylenediamine), NH$_3$, py (pyridine), CH$_3$CN, NCS$^-$, H$_2$O, C$_2$O$_4^{2-}$, OH$^-$, F$^-$, N$_3^-$, NO$_3^-$, Cl$^-$, SCN$^-$, S$^{2-}$, Br$^-$, and I$^-$. Theoretically, the crystal field splitting energy ($\Delta_0$) is not directly related to the Mott-charge transfer barrier or the Rice-Brickman mass. However, the stability of the metal-native ligand coordination sphere allows the electron-electron correlations inductive of these transitions to occur in a particular material as the nuances of the bonding and crystal structures are set in place. In any case, the technical relevant effect is to control or stabilize the oxidation number (or coordination sphere) in such a way the local stoichiometry is "nominal" or otherwise suitable to induce the necessary electron correlation conditions.

"Extrinsic ligand" or "dopant ligand" is defined herein to be the ligand material added to transition metal complexes to stabilize the multiple valence states of the transition metals. The ligand splits the d-orbitals. We use the term "extrinsic" or "dopant" because the ligand complex is an extrinsic material added to the lattice that is not intrinsic to the lattice structure of the transition metal compound. For example, in NiO, the oxygen is an intrinsic ligand, and (CO)$_4$, in forming Ni(CO)$_4$, is the extrinsic ligand. Similarly, other variants such $Ni_5(CO)_{12}$ (nickel carbonate) include a form of CO as extrinsic ligands to the basic NiO lattice. This is analogous to the use of the term "dopant" in semiconductor technology. That is, in semiconductor technology, adding a dopant to silicon, for example, does not change the silicon so much that we refer to it as another compound. Likewise, the dopant ligand added to say, nickel oxide, does not change the fact that the material is nickel oxide. However, local correction of the many possible oxidation numbers (valences) of Ni, such as Ni vacancies, interstitials and oxygen vacancies that modify the nominal "+2" valence value, is achieved with ligands that mediate with the intrinsic ligand yielding a stable net oxidation number and eliminate the defect-induced change in charge state.

Figure 13:
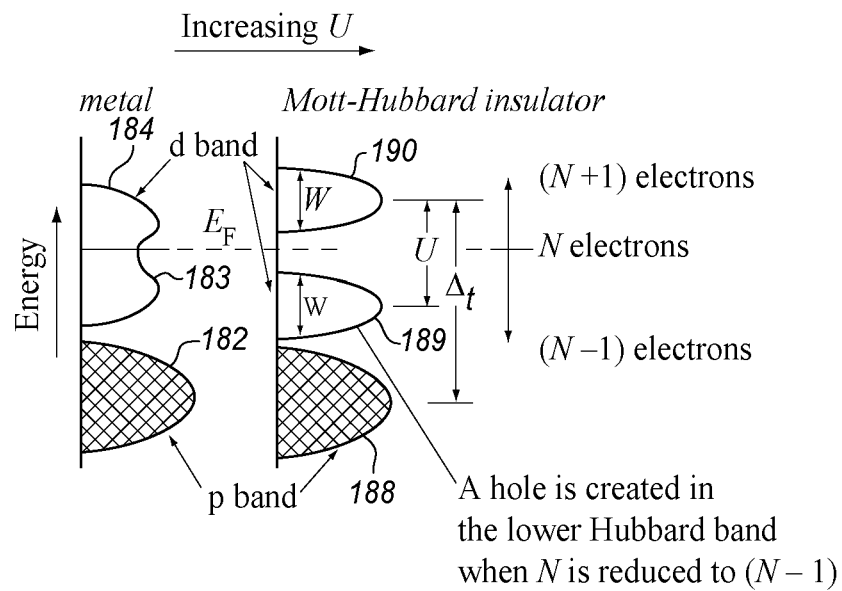
FIG. 13 is an illustration of the energy bands of a Mott-Hubbard insulator taken from *Introduction to the Electron Theory of Metals* by Uichiro Mizutani.
Figure 14:
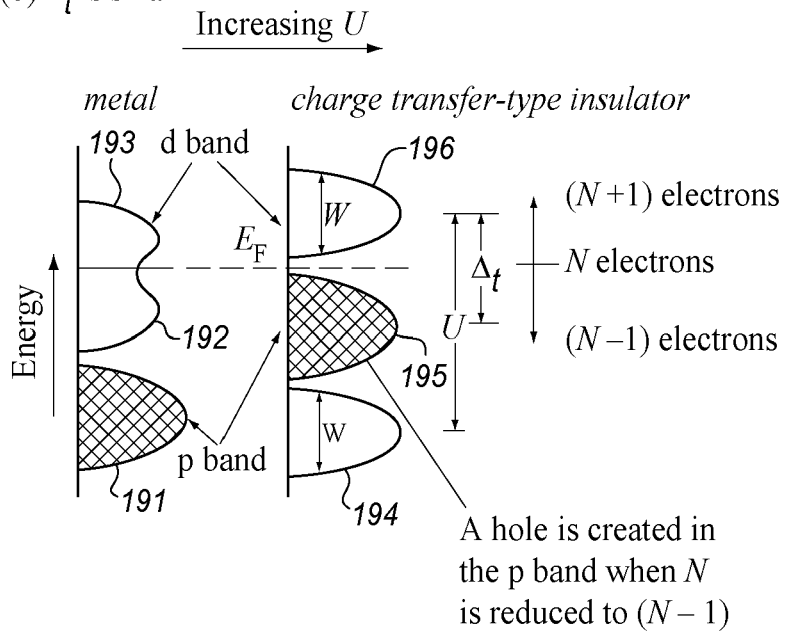
FIG. 14 is an illustration of the energy bands of a charge transfer type insulator taken from *Introduction to the Electron Theory of Metals* by Uichiro Mizutani.

The band structure of correlated electron materials according to the invention is complex and depends not only on the d-orbitals of the transition metals but also on the p-orbitals of the neighboring oxygen atoms. This is explained in detail in *Introduction to the Electron Theory of Metals*, Uichiro Mizutani, Cambridge University Press, Cambridge, UK, 2001, particularly pages 444-447, which is incorporated herein by reference to the same extent as though fully disclosed herein. FIGS. 14.9(a) and 14.9(b) from page 446 of this book are reproduced herein at FIGS. 13 and 14. The Δ used in this section is different than the Δ discussed above, so we shall refer to it as $Δ_t$, since it is the charge transfer energy, i.e., the energy to transfer of 3*d* electrons to the oxygen atom. In these figures, U is the d-orbital coulomb energy, sometimes referred to as the correlation energy, and $E_F$ is the Fermi level of the transition metal.

In both the Mott-Hubbard insulator of FIG. 13 and the charge transfer-type insulator of FIG. 14, when the density of electrons is small, U is small; and the d-orbitals 183, 192 and 184, 193, representing the density of states, overlap forming a wide d band with few electrons, while the filled p-orbital density of states 182, 191 is split from and below the d-band. Thus, the d-orbital density of states behaves much like a metal, and the material is conducting. As the density of electrons becomes large, differences occur. When $Δ_t$ is larger than U, as in FIG. 13, the d-orbitals split into a pair of separated bands 189 and 190, and the p-orbital 188 remains below the d-orbital bands.

When $Δ_t$ is smaller than U, the p-orbital of the intrinsic ligand splits the d-orbital which tends to stabilize the d-orbital valence, yielding a net oxidation state of zero, for example, $Ni^{+2}O^{-2}$. In such conditions, the insulator is a charge-transfer insulator, which leads to lower operating voltages. Thus, correlated electron systems in which $Δ_t<U$ are preferred systems. One way of understanding the resistive change of the CEM materials can be seen most easily using FIG. 14. As indicated above, when the density of electrons is small, the two d-orbital bands 192 and 193 overlap and a conductor results. As the density of electrons increases, it will reach a point where the coulomb repulsion is so high that the d-orbitals 194 and 195 split with the filled p-orbital valence band between them. One d-orbital 194 is essentially filled, while the other 196 is empty. It requires a large amount of energy for electrons to jump from the lower band 194 into the upper band 196. Even if a d-d transition could occur with the aid of a hole in the p-orbital band, this requires a higher voltage, which is useful in the insulator to metal transition but not in the metal to insulator transition. Thus, this material will be an insulator with high resistance when the lower voltage induces a metal to insulator transition purely caused by increasing the local density of electrons. However, when the electric field created by the applied voltage becomes large enough, some electrons will begin to jump to the upper band 196. This creates an overlap of the upper empty band and lower filled d-bands, the condition of a highly conductive state with small coulomb repulsion, and the system collapses back to the state shown at the left in FIG. 14. From FIG. 14, it is also clear that transitions can be made from the p-orbital to the d-orbital which create "holes", which can be filled by electrons from filled d-bands. The interaction of d-d orbital transitions is highly dependent on the existence of p-orbitals in these CEM compounds. The absence of an oxygen atom in the lattice induces a +2 charge, i.e., a doubly charged vacancy, which would be neutralized if the oxygen would return with its −2 valence. Since this does not happen once the defect is in place, the Ni or other transition metal no longer coordinates or bonds normally with the oxygen. Thus, the emission of up to two electrons into this positive potential makes the Ni become +4, with the result that it is no longer useful for a Mott or charge transfer condition. It is at this point that mediation between the defect and an extrinsic ligand re-establishes the oxidation state of the nickel. Without the ligand, the unbalanced, unstable insulative state is either heavily saturated with coordination-destroying oxygen vacancies or equally detrimental and related excess nickel anions in interstitial sites in the lattice.

The metal-ligand-anion (MLA) bond which stabilizes the correlated electron material in some embodiments can be formed in many ways. For example, it may be formed in an anneal or other reaction process. For example, the CEMs may be annealed in a gas that contains the ligand chemical element, the anion element, and preferably also includes both the ligand element and the anion element. Any gas incorporating any of the ligands above may be used. The gas may be formed through conventional precursor vaporization processes, such as heating and bubbling. As another example, the CEM may be reactive sputtered in a gas containing the ligand chemical element, the anion element, or both. Again, any of the ligands above may be used. As an example, for NiO, with a carbon ligand and an oxygen anion, CO and $CO_2$ are possible annealing gases. The anneal may be performed with one or more of these gases, or may be performed in a mixture of an inert gas, such as argon or nitrogen, with the gas containing either the ligand element, the anion element, or both.

For additional understanding of ligand field theory and the related ligand chemistry, see *An Introduction to Transition-Metal Chemistry: Ligand-Field Theory*, Leslie E. Orgal, Methuen & Co. Ltd., London, 1960, which is hereby incorporated by reference to the same extent as though fully disclosed herein.

An alternative understanding of the resistive switching phenomenon can be obtained from Mott Insulator theory, as explained, for example, in *Metal-Insulator Transitions*, Sir Nevill Mott, Second Edition, Taylor & Francis, London, 1990, and the Hubbard Model, as explained, for example, in *The Hubbard Model*, Arianna Montorsi Ed., World Scientific, Singapore, 1992. This understanding can be briefly summarized by considering the basic voltage versus current curve showing the effect of the resistance switching on the current as the voltage is increased, as, for example, that shown in FIG. 5. At zero voltage, the NiO is in a paramagnetic phase and has zero current. As the voltage is increased, the current rises in the region 110, due to the fact that the electric field is giving electrons enough energy to jump up into the conduction band. The number of electrons continue to increase until the Mott transition condition $(n_C)^{1/3}a=0.26$, where $n_C$ is the concentration of electrons and a is the Bohr radius, is reached at point 115. As described by Mott, at this point, the electron gas condenses and the material becomes an anti-ferromagnetic insulator. This is the RESET state. As the voltage continues to increase along line 112, there is a minor increase in current until the point 116 where the electric field energy becomes equal to what the thermal energy would be if the material was at the Neel temperature, which is about 550K for NiO. At this point, there is an electronic phase change of the material back to the paramagnetic state, which state remains even if the voltage is reduced back to the lower voltage range or portion of the curve. This is the SET state. In some modern theoretical approaches to this phase transition, the term "electron liquid" refers to the state of heavy mass, and this "electron condensation" phenomenon and electron gas refers to the uncorrelated electron. Electron liquids, such as in the Landau theory of "Fermi-liquids" are still a very immature area of condensed matter physics, and the term is used here only to describe highly correlated electrons, as in the liquid state, versus non-interacting electrons as in the electron gas.

FIGS. 15 and 16 illustrate a non-volatile memory according to the invention. In this context, the word "substrate" can mean the underlying semiconductor material 82 (FIG. 4) or 444 (FIG. 15) on which the integrated circuit is formed, as well as any object, such as layer 88 in FIG. 4, on which a thin film layer, such as 90, is deposited. In this disclosure, "substrate" shall generally mean the object to which the layer of interest is applied. For example, when we are talking about a thin film 90 of FIG. 4, the substrate on which it is initially deposited may include various elements, in particular, bottom electrode 88.

The long horizontal dimensions of substrates 82, 444 define planes that are considered to be a "horizontal" plane herein, and directions perpendicular to this plane are considered to be "vertical". The terms "lateral" or "laterally" refer to the direction of the flat plane of the semiconductor substrate, that is, parallel to the horizontal direction. Terms of orientation herein, such as "above", "top", "upper", "below", "bottom", and "lower" mean relative to substrates 82, 444. That is, if a second element is "above" a first element, it means it is farther from semiconductor substrate 82, 444; and if it is "below" another element, then it is closer to semiconductor substrate 82, 444, than the other element. Terms such as "above", "below", or "on" do not, by themselves, signify direct contact. However, terms such as "directly on" or "onto" do signify direct contact of one layer with an underlying layer. However, "directly above" does not require direct contact, but rather means that if a line is drawn perpendicular to the underlying substrate and the line passes through the first element, it also will pass through the second element. It is understood that thin films of CEM fabricated in accordance with the invention have various shapes and conform to various topographies and features of an integrated circuit substrate. Accordingly, thin films of CEM in accordance with the invention are formed on planar substrates, in trenches and vias, on vertical sidewalls, and in other various non-horizontal and three-dimensional shapes.

The term "thin film" is used herein as it is used in the integrated circuit art. Generally, it means a film of less than a micron in thickness. The thin films disclosed herein are typically less than 500 nanometers (nm) in thickness. A thin film of correlated electron material fabricated by a method in accordance with the invention typically has a final thickness in a range of about from 20 nm to 300 nm, preferably in a range of about from 25 nm to 150 nm. The thin films having a thickness of about 60 nm or less are specifically designated "ultra-thin films" in this specification. These thin films and ultra-thin films of the integrated circuit art should not be confused with the layered capacitors of the macroscopic capacitor art which are formed by a wholly different process that is incompatible with the integrated circuit art.

FIG. 15 is a cross-sectional view of a 1 transistor/1 resistor CEM switching cell 440 according to the invention. Cell 440 is formed on semiconductor wafer 444, which is preferably p-type silicon, but may be any other semiconductor. N-type active areas 452 and 453 are formed in wafer 444, and gate insulator 456 and gate 458 are formed over channel region 455 between the active areas as in conventional CMOS structures. A CEM device 446 is formed on one active area 453 and a metallization contact layer 466 is formed on the other active area 452. CEM device 440 comprises bottom electrode 460, CEM layer 462, and top electrode 464. These layers are patterned, preferably with an etch, and more preferably with a dry etch to form device 446. After patterning, the integrated circuit then is completed to include the CEM material as an active element in an integrated circuit. Here, "active element" means an element that changes in response to the application of current or voltage. While this structure is similar to 1T/1C DRAM and ferroelectric memory structures, CEM layer 462 does not store charge but rather switches resistance states. The resistance state can be identified by the voltage drop across the CEM device 446.

FIG. 16 is a block diagram of a memory circuit 900 including an exemplary electronic phase change memory array 902 according to the principles of the present invention connected to write and read circuitry. The memory cells in CEM memory array 902 may be any of the memory cells described above. In one embodiment, CEM memory array 902 is formed of 128×128 memory cells. However, CEM memory array 902 may have virtually any size as is understood in the art. CEM memory array 902 may be connected to a 7-bit decoder word line drive circuit 904 via word lines 906. CEM memory array 902 may be further coupled to a 3-to-1 bit multiplexer 908 and sense amplifiers/input-output transistors 910 via bit lines 912. Control logic circuitry 914 may be in communication with (i) the decoder 904 via control lines 916, (ii) multiplexer 908 via control lines 918, and (iii) sense amplifier 910 via control lines 920. External input lines may include an address input line 922 and control lines 924. A data output line 926 may be used to output data from memory circuit 900 via sense amplifiers/transceivers 910.

In operation, an external processor may be used to drive the control logic 914. Control logic circuitry 914 communicates with decoder 904, multiplexer 908, and sense amplifiers 910, which, in combination, are used to write data into CEM memory array 902 and read data stored in CEM memory array 902. Control logic 914 and decoder 904 comprise a write circuit 928 for placing the resistive switching memory cell in a first resistive state or a second resistive state depending on information input into the memory; and control logic 914, multiplexer 908, and sense amps 910 comprise a read circuit 929 for sensing the state of the memory cell and providing an electrical signal corresponding to the sensed state of the memory cell. As is known in the art, the first resistance state may correspond to a logic "0" state, and the second resistance state may correspond to a logic "1" state, or vice versa. Herein, for convenience, we have referred to the first resistance state as the ON or low resistance state and the second resistance state as the OFF or high resistance state.

The correlated electron resistance switching material is particularly suited for memories, preferably non-volatile memories. A wide variety of such memories are possible, some of which have been discussed above.

Since a CEM retains the resistance state it is placed in indefinitely with no voltage or electric field applied to it, all of the CEM devices described herein are inherently non-volatile switching devices. As known in the art, non-volatile switching devices can be used as or in non-volatile memories. Thus, all of the devices described above also comprise a non-volatile memory cell, or cells in the case of the structures which show multiple CEM elements. Thus, it should be understood that, whether the device has been referred to as a CEM element, a switch, a switching cell, a memory cell, or a memory in the above discussion, it has been determined by the context, and in all cases the other terms apply also.

A CEM memory cell is written to by applying either a SET or RESET voltage between the top electrode 92, 464 and the bottom electrode 88, 460. The CEM switching cell 440 of FIG. 16 can be read similarly to a ferroelectric or DRAM memory, using the select transistor 454 to select the cell to be read or written. A voltage or current is placed across the cells, and the resistance state of the CEM determines the voltage or charge developed across the cell, and by sense amplifiers 910. It is evident that, if the CEM is conductive, the voltage drop across the CEM will be much smaller than the voltage drop when the CEM is insulating. It is evident that this read can be described in terms of reading a resistance, a voltage, or a current. That is, referring to FIG. 1, if a read voltage of, say, about 0.3 volts, is placed across the cell, there will be a large resistance, voltage, or current difference between a cell that is in the state represented by curve 47 and a cell that is in the state represented by curve 44. In any description, it is evident that the read is inherently non-destructive, because the read voltage is well below $V_{RESET}$ and $V_{SET}$.

The thin films disclosed herein were deposited via a liquid deposition process, preferably a process in which carbon is introduced into the material. While a spin-on process was used, the films could also be deposited by MOCVD, dipping, liquid source misted deposition, other CSD (chemical solution deposition) methods, or by depositing a metal and then oxidizing it with a carbon donor compound present in the atmosphere, or precursors or by atomic layer deposition (ALD). In making the films, metallorganic precursors were deposited and reacted to form the desired material. Single layer films showed cracking, but multilayer films were of electronic device quality. An octane precursor provided the best results. These represent "first try" results, and the experience of the Applicants indicates that good extremely thin films are possible with any liquid source deposition process, including MOCVD, and with the process of depositing a metal and then oxidizing it. Results with a furnace anneal of 450° C. show that, on Pt, the films are smooth and are fine-grained. Results remained good with anneals in the range of 550° C. to 650° C. Also, as discussed more fully elsewhere, it is found to be advantageous to include carbon ligand doping in the material. Further, it has been found that annealing in a gas containing the ligand materials may be advantageous. Further, the gas preferably also includes the anion to which the ligand bonds the metal. For example, annealing of nickel oxide in carbon monoxide (CO) or carbon dioxide ($CO_2$) may provide the carbon ligand and the oxygen anion in the metal-ligand-anion bonds that stabilize the nickel oxide. Alternatively, the CEM materials may be sputtered and then annealed in the ligand-containing gas, or may be reactive sputtered in the ligand-containing gas. For example, nickel may be reactive sputtered in CO or $CO_2$.

The following are examples of actual CEM material fabrication processes.

EXAMPLE I

A 2000 Å (Angstrom) layer of platinum was deposited on a wafer with a silicon dioxide coating. Then a 0.2 molar nickel oxide precursor in an octane solution was deposited by spin coating the platinum layer at 3000 rpm (rounds per minute). The nickel oxide precursor is available from Kojundo Chemical Company, Tokyo, Japan. The precursor was baked at 150° C. for 1 minute, and then at 260° C. for four minutes to produce an approximately 100 Å dry layer. The spin-on deposition and baking processes were repeated six times for a total thickness of 600 Å. Then a crystallization anneal was performed in a furnace at 450° C. in an oxygen atmosphere for 40 minutes to produce a 600 Å layer of the CEM nickel oxide according to the invention. Electron microscopy revealed that a significant amount of carbon was present in the material, with the carbon coming from the octane precursor. A top electrode of 2000 Å of platinum was deposited. Then the top electrode and CEM layer were patterned by dry etching, preferably ion milling, down to the bottom electrode platinum layer. Finally, a recovery anneal was performed in a furnace at 450° C. in an oxygen atmosphere for approximately one hour to produce the films discussed with respect to FIGS. 9-12 above.

EXAMPLE II

This example was made in the same way as Example I above except that 5% ammonia was added to the precursor. The films produced yielded similar results.

The invention includes an annealing process for CEMs. The CEM may be annealed in a gas containing at least one chemical element for forming a ligand which stabilizes the electronic properties of the CEM. Preferably, the CEM is a transition metal and the chemical element comprises carbon. Preferably, the gas comprises a gas selected from CO and $CO_2$. Preferably, the CEM is nickel.

The invention also provides a sputtering method of making a CEM. The material may be sputtered and then annealed as described above, or reactive sputtering of the CEM in a gas containing at least one chemical element for forming a ligand which stabilizes the electronic properties of the CEM may be employed. Preferably, the CEM is a transition metal and the chemical element comprises carbon. Preferably, the gas comprises a gas selected from CO and $CO_2$. Preferably, the CEM is nickel oxide.

Figure 17:
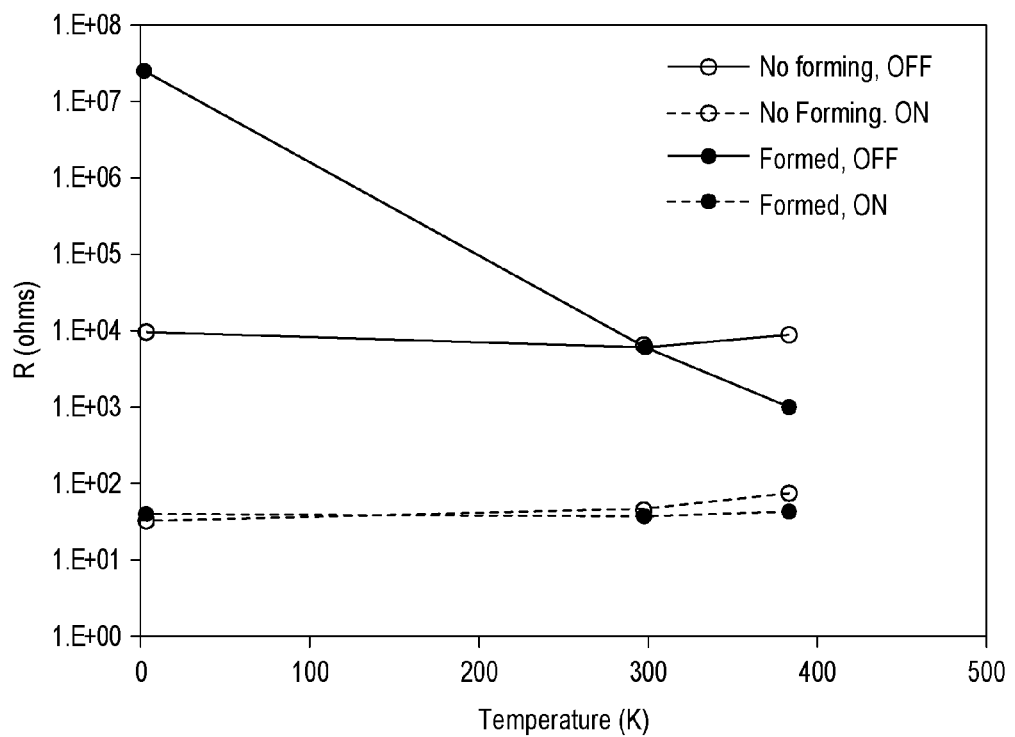
FIG. 17 shows a graph of Kelvin temperature versus resistance in Ohms for the ON and OFF states for a CEM thin film according to the invention and for a prior art thin film that crystallizes in the OFF state and requires forming before exhibiting variable resistance.

FIG. 17 shows a graph of Kelvin temperature versus resistance in Ohms for the ON and OFF states for a CEM thin film according to the invention and for a prior art thin film that crystallizes in the OFF state and requires forming before exhibiting variable resistance. As shown in the graph, for the CEM material, $NiO(C_x)$ in this case, the ON and OFF states vary only a little with temperature over the entire 400° K temperature range. Both curves rise a little at the higher temperatures. The rise is essentially uniform for both the ON and OFF state, so the resistance window remains essentially the same. Clearly, a memory made with the CEM material will be stable over any temperature range that memories should be stable over. However, for the prior art NiO film, without carbon, the OFF state changes linearly with temperature, while the conducting state is essentially flat. The resistance window changes by more than 500%. Just over the reasonable range that a memory must work, from about 250° K to about 350° K, the memory window changes by about over 100%. This prior art material clearly could not be used in a memory.

Figure 18:
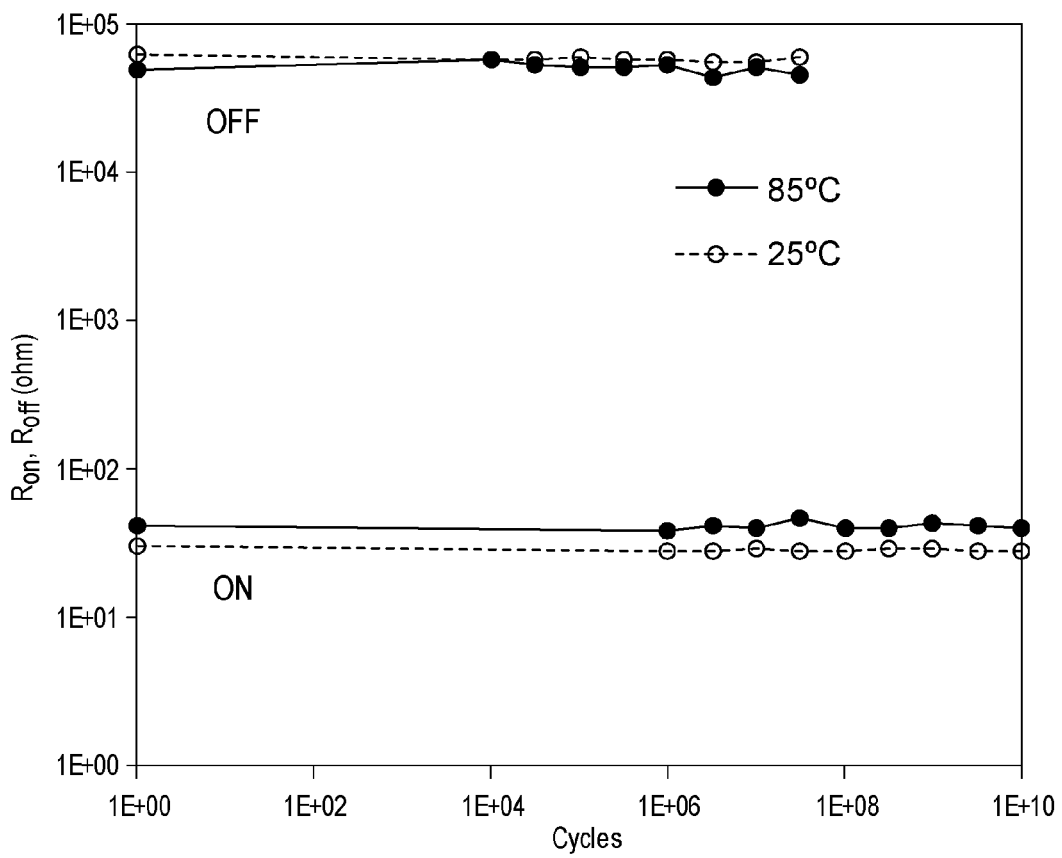
FIG. 18 is a graph of number of reading cycles versus resistance in Ohms for the ON and OFF states for a CEM thin film according to the invention, demonstrating that there is little or no fatigue.

FIG. 18 is a graph of a number of reading cycles versus resistance in Ohms for the ON and OFF states for a CEM thin film according to the invention. Measurements were made at both 25° C. and 85° C. Reading fatigue measures the resistance in Ohms versus number of read cycles, where a read cycle comprises the application of a read voltage of one volt across the resistance element for a sufficient time to come to equilibrium with a reference voltage, followed by the removal of the voltage for a sufficient time to come to equilibrium at zero voltage. The measurements of reading fatigue were made for both the ON state and the OFF state at 85° C. and 25° C. The ON state was measured out to $10^{10}$ cycles, and the OFF state was measured only to $10^8$ cycles because of time constraints. Both curves were flat, i.e., showing essentially no change in the measured resistance values for the 25° C. measurement, and showing a minor variation of about two percent for the 85° C. measurement. This graph demonstrates there is little or no fatigue for the CEM material. Thus, a memory made of CEM material will be stable over any conceivable number of read cycles. Write fatigue has not yet been measured due to time constraints, though every indication is that it also will be essentially nil.

Figure 19:
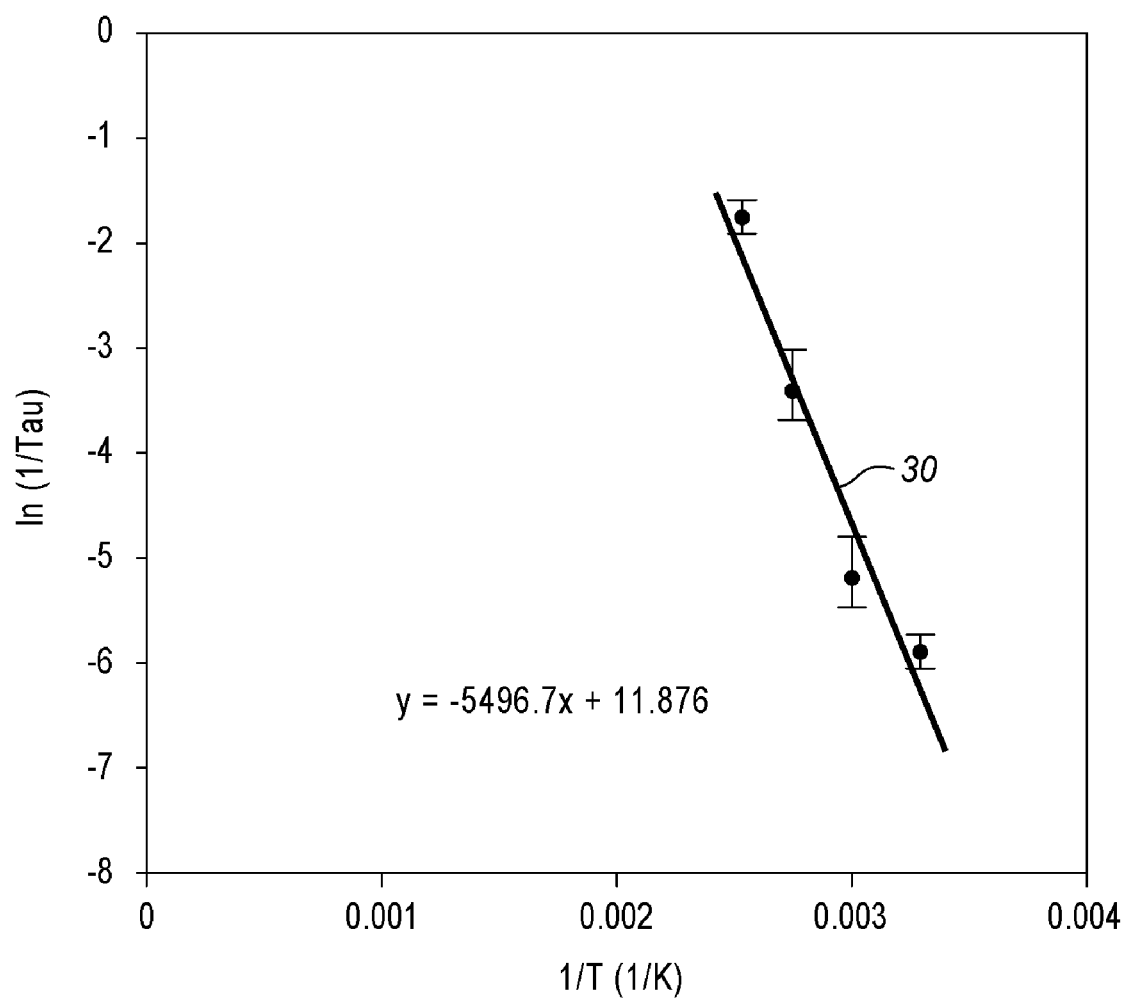
FIG. 19 is an Arrhenius curve of the log of 1/Tau versus 1/T(1/K) for prior art sputtered NiO (without carbon) illustrating that the transition from the high resistance state to the low resistance state is caused by detrapping of electrons from oxygen vacancies in the sputtered NiO.

The fact that the CEM materials are in the low resistance state, or ON state, as deposited demonstrates a vacancy coordination passivation effect. The vacancy coordination sphere is the region about an ion or electron in which vacancies can effect the ion or electron. As shown by FIG. 19, in NiO made by the principle prior art process, vacancies within this vacancy coordination sphere trap electrons which are subsequently thermally detrapped. This destabilizes the high resistance state. This is the principle reason for the instability of prior art variable resistance materials. In the preferred embodiment of the invention, the effect of the oxygen vacancies is canceled by the ligand structure of the CeRAM materials according to the invention. As shown by FIGS. 10, 11, and 17, the resistance states of the CEMs according to the invention are thermally stable. This further demonstrates vacancy coordination passivation. However, now that it has been shown that an essentially homogeneous CEM can be made, and how advantageous it is for a resistive memory, those skilled in the art will be able to make a CEM by other methods, and that a CEM made by other methods will also be useful.

The particular systems, memory designs, and methods described herein are intended to illustrate the functionality and versatility of the invention, but the invention should not be construed to be limited to those particular embodiments. It is evident that those skilled in the art may make numerous uses and modifications of the specific embodiments described, or equivalent structures and processes may be substituted for the structures and processed described. For example, the memory is shown with the CEM elements and their associated transistors arranged in columns. The CEM elements may just as well have been arranged in rows. Thus, herein, the arrangement is referred to as a row/column arrangement. Further, while in some instances the preferred type of semiconductor wafer has been specified, it should be understood that, in any of the devices described, any semiconductor can be used. Further, in many instances, the specific type of semiconductor has been specified, e.g., n-type, p-type, n+, p+, etc.; those skilled in the art will recognize that other types may be used. For example, most devices work essentially the same if n-type is replaced with p-type and p-type is replaced with n-type. As another example, though platinum electrodes have been given as examples, those skilled in the art will recognize that such electrodes preferably are formed with a thin adhesive layer of titanium, and that the entire literature of oxide structures on platinum/titanium electrodes and the top electrode literature involving platinum, titanium, tungsten, aluminum, copper, and other materials can be applied. Any place a semiconductor is mentioned, those skilled in the art will recognize that gallium arsenide, germanium, germanium/silicon, and other semiconductor technologies can be substituted. As mentioned above, the term "metal" or "M" is used herein to indicate any suitable conductor, including metals such as platinum and tungsten, or polysilicon, or other conventional conductors known in the art. Since certain changes may be made in the above systems and methods without departing from the scope of the invention, it is intended that all subject matter contained in the above description or shown in the accompanying drawings may be interpreted as illustrative and not in a limiting sense; consequently, the invention is to be construed as embracing each and every novel feature and novel combination of features present or inherently possessed by the systems, devices, and methods described in the claims below and their equivalents.

What is claimed as new and desired to be protected by Letters Patent of the United States is:

1. A resistive switching integrated circuit memory comprising:
    a resistive switching memory cell including a correlated electron material (CEM);
    a write circuit for placing said resistive switching memory cell in a first resistive state or a second resistive state depending on information input into said memory, wherein the resistance of said CEM is higher in said second resistance state than in said first resistance state; and
    a read circuit for sensing the state of said memory cell and providing an electrical signal corresponding to the sensed state of said memory cell;
    wherein said memory is capable of being read $10^8$ times with less than 50% fatigue.

2. A resistive switching memory comprising:
    a resistive switching memory cell including a correlated electron material (CEM);
    a write circuit for placing said resistive switching memory cell in a first resistive state or a second resistive state depending on information input into said memory, wherein the resistance of said CEM is higher in said second resistance state than in said first resistance state; and
    a read circuit for sensing the state of said memory cell and providing an electrical signal corresponding to the sensed state of said memory cell;
    wherein said memory has a memory window that changes less than 50% over a temperature range of from minus 50° C. to 75° C.

3. A resistive switching memory as in claim 2 wherein the resistance of said CEM in said second memory cell state is more than 200 times the resistance in said second memory cell state.

4. A resistive switching memory comprising:
    a resistive switching memory cell including a correlated electron material (CEM);
    a write circuit for placing said resistive switching memory cell in a first resistive state or a second resistive state depending on information input into said memory, wherein the resistance of said CEM is higher in said second resistance state than in said first resistance state; and
    a read circuit for sensing the state of said memory cell and providing an electrical signal corresponding to the sensed state of said memory cell;
    wherein said CEM switches resistive states due to a Mott-transition in the majority of the volume of said CEM.

* * * * *